US011696473B2

(12) United States Patent
Lee

(10) Patent No.: US 11,696,473 B2
(45) Date of Patent: Jul. 4, 2023

(54) DISPLAY DEVICE

(71) Applicant: Samsung Display Co., Ltd., Yongin-si (KR)

(72) Inventor: Dae Geun Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 477 days.

(21) Appl. No.: 16/785,642

(22) Filed: Feb. 9, 2020

(65) Prior Publication Data

US 2020/0295113 A1 Sep. 17, 2020

(30) Foreign Application Priority Data

Mar. 13, 2019 (KR) .......... 10-2019-0028548

(51) Int. Cl.
*H10K 59/131* (2023.01)
*H05K 1/14* (2006.01)

(52) U.S. Cl.
CPC .......... *H10K 59/131* (2023.02); *H05K 1/147* (2013.01); *H05K 2201/056* (2013.01); *H05K 2201/10128* (2013.01)

(58) Field of Classification Search
CPC ............ G02F 1/13458; G02F 1/13452; G02F 1/136213; G02F 1/13306; G02F 1/1309; G02F 1/133502; G02F 1/133512; G02F 1/133514; G02F 1/1351; G02F 1/1345; G02F 1/1362; G02F 1/136254; G02F 1/133305; G02F 1/133345; G02F 1/136286; G02F 1/136227; G02F 1/136295; G02F 1/1368; H01L 27/3276; H01L 51/0097; H01L 27/3223; H01L 27/323; H01L 51/5253; H01L 22/32; H01L 23/60; H01L 33/44; H01L 51/5281; H01L 51/5284; H01L 27/124; H01L 27/3258; H01L 51/56; H01L 27/3262; H01L 51/0031; H01L 27/3265; H01L 51/5256; H01L 51/2581; H01L 27/1244; H01L 27/1218;
(Continued)

(56) References Cited

U.S. PATENT DOCUMENTS 6,288,414 B1 9/2001 Ahn
7,790,595 B2 9/2010 Asakawa et al.
(Continued)

FOREIGN PATENT DOCUMENTS

KR 10-0307385 8/2001
KR 10-1741820 5/2017
KR 10-2018-0000046 1/2018

*Primary Examiner* — Mouloucoulaye Inoussa
(74) *Attorney, Agent, or Firm* — H.C. Park & Associates, PLC

(57) ABSTRACT

A display device includes a display substrate, a first connection wiring, and a signal wiring. The display substrate includes a display area and a pad area disposed outside the display area. The first connection wiring is disposed on the pad area of the display substrate. The signal wiring is disposed on the first connection wiring of the pad area of the display substrate. The signal wiring is electrically connected to the first connection wiring through a first contact hole. The signal wiring includes at least one first opening at least partially surrounded by the signal wiring in a plan view. The first opening is disposed closer to the display area than the first contact hole.

20 Claims, 25 Drawing Sheets

(58) Field of Classification Search
CPC ............. H01L 27/1225; H01L 27/1248; H01L 21/76895; H01L 27/1259; H01L 27/3246; H01L 27/12; H01L 27/3248; H01L 25/18; H01L 23/49838; H01L 23/4985; H05K 1/147; G06F 3/0412; G06F 3/0443; G06F 1/1643; G06F 3/0446; G06F 1/1652; G06F 3/0418; G06F 3/0445; G06F 3/04164; Y02E 10/549; G09G 3/3611; G09G 3/006; G09G 3/3208; G09G 3/3275; G09G 3/035; G09G 3/3225; G09G 3/3223; G02B 1/11; H05B 45/60
USPC ........ 257/43, E21.532; 438/23, 29; 349/151, 349/245, 122, 40, 150, 152; 345/87, 100; 315/297; 327/108
See application file for complete search history.

(56) References Cited

U.S. PATENT DOCUMENTS

| | | | |
|---|---|---|---|
| 10,217,806 B2 | 2/2019 | Kim et al. | |
| 2008/0030668 A1* | 2/2008 | Komaju | G02F 1/1345 349/151 |
| 2008/0204618 A1* | 8/2008 | Jung | G02F 1/13452 349/40 |
| 2010/0149473 A1* | 6/2010 | Guo | G02F 1/1345 349/122 |
| 2013/0307761 A1* | 11/2013 | Kwak | G02F 1/13452 315/297 |
| 2014/0292628 A1* | 10/2014 | Park | G09G 3/3677 327/108 |
| 2015/0187803 A1* | 7/2015 | Moh | H01L 27/1225 438/23 |
| 2018/0014405 A1* | 1/2018 | Kim | H01L 24/32 |
| 2018/0040672 A1* | 2/2018 | Park | G06F 3/0443 |
| 2018/0145125 A1* | 5/2018 | Lee | H01L 51/0097 |
| 2018/0197484 A1* | 7/2018 | Moon | H01L 27/1248 |
| 2018/0261657 A1* | 9/2018 | Kim | H01L 51/5056 |
| 2018/0284507 A1* | 10/2018 | Xu | G02F 1/13458 |
| 2018/0366494 A1* | 12/2018 | Lee | H01L 27/1259 |
| 2019/0027076 A1* | 1/2019 | Lee | G09G 3/3611 |
| 2020/0105657 A1* | 4/2020 | Lee | H01L 27/3276 |
| 2020/0271983 A1* | 8/2020 | Lee | G02F 1/133502 |
| 2020/0273922 A1* | 8/2020 | Park | H01L 51/0097 |
| 2020/0312923 A1* | 10/2020 | Kim | H01L 27/3258 |
| 2021/0125566 A1* | 4/2021 | Yang | H01L 27/124 |
| 2021/0321517 A1* | 10/2021 | Kim | G06F 1/183 |

* cited by examiner

DISPLAY DEVICE

CROSS-REFERENCE TO RELATED APPLICATION

This application claims priority to and the benefit of Korean Patent Application No. 10-2019-0028548, filed Mar. 13, 2019, which is hereby incorporated by reference for all purposes as if fully set forth herein.

BACKGROUND

Field

Exemplary embodiments generally relate to a display device.

Discussion

A display device is a device for visually displaying data. Such a display device typically includes a substrate divided into a display area and a non-display area. A plurality of pixels may be arranged on the substrate in the display area, and a plurality of pads may be arranged on the substrate in the non-display area. The plurality of pads may be connected with a flexible film including a driving integrated circuit (IC) or the like, mounted (or coupled) thereon in a chip-on-film (COF) manner. The driving IC may be configured to transmit driving signals to the pixels as part of visually displaying the data. The flexible film typically includes a plurality of leads connected with the plurality of pads. Each of the leads may be bonded to a separate pad. The bonding may be performed by an ultrasonic bonding process.

Methods of inspecting the state of ultrasonic bonding between the pads and the leads include destructive inspection and non-destructive inspection. Destructive inspection is a method of observing the bonding interface between the pads and the leads by cutting one or more of the pads and the leads in a direction, such as vertical direction, and inspecting the state of the bonding interface. Non-destructive inspection is a method of observing the bonding interface using an imaging device or the like without destroying the pads and the leads that are in contact with each other. Non-destructive inspection techniques are advantageous in that they typically take less time for inspection than destructive inspection techniques, and the structure being inspected need not be damaged.

The above information disclosed in this section is only for understanding the background of the inventive concepts, and, therefore, may contain information that does not form prior art.

SUMMARY

Some exemplary embodiments are capable of providing a device including an ultrasonic bonding inspection unit, which may be configured to easily receive a signal from a connection unit.

Additional aspects will be set forth in the detailed description which follows, and, in part, will be apparent from the disclosure, or may be learned by practice of the inventive concepts.

According to some exemplary embodiments, a display device includes a display substrate, a first connection wiring, and a signal wiring. The display substrate includes a display area and a pad area disposed outside the display area. The first connection wiring is disposed on the pad area of the display substrate. The signal wiring is disposed on the first connection wiring of the pad area of the display substrate. The signal wiring is electrically connected to the first connection wiring through a first contact hole. The signal wiring includes at least one first opening at least partially surrounded by the signal wiring in a plan view. The first opening is disposed closer to the display area than the first contact hole.

According to some exemplary embodiments, a display device includes a display substrate, a connection wiring, a signal wiring, and a flexible circuit board. The display substrate includes a display area and a pad area disposed outside the display area. The connection wiring is disposed on the pad area of the display substrate. The signal wiring is disposed on the connection wiring of the pad area of the display substrate. The signal wiring is electrically connected to the connection wiring through a contact hole. The flexible circuit board includes a lead wiring attached to the pad area of the display substrate. The flexible circuit board overlaps the signal wiring. The signal wiring includes a first opening at least partially surrounded by the signal wiring in a plan view. The connection wiring includes a second opening at least partially surrounded by the connection wiring and overlapping the first opening in a thickness direction in the plan view. The first opening and the second opening are disposed closer to the display area than the contact hole.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts. In the drawings.

DETAILED DESCRIPTION OF SOME EXEMPLARY EMBODIMENTS

Figure 1:
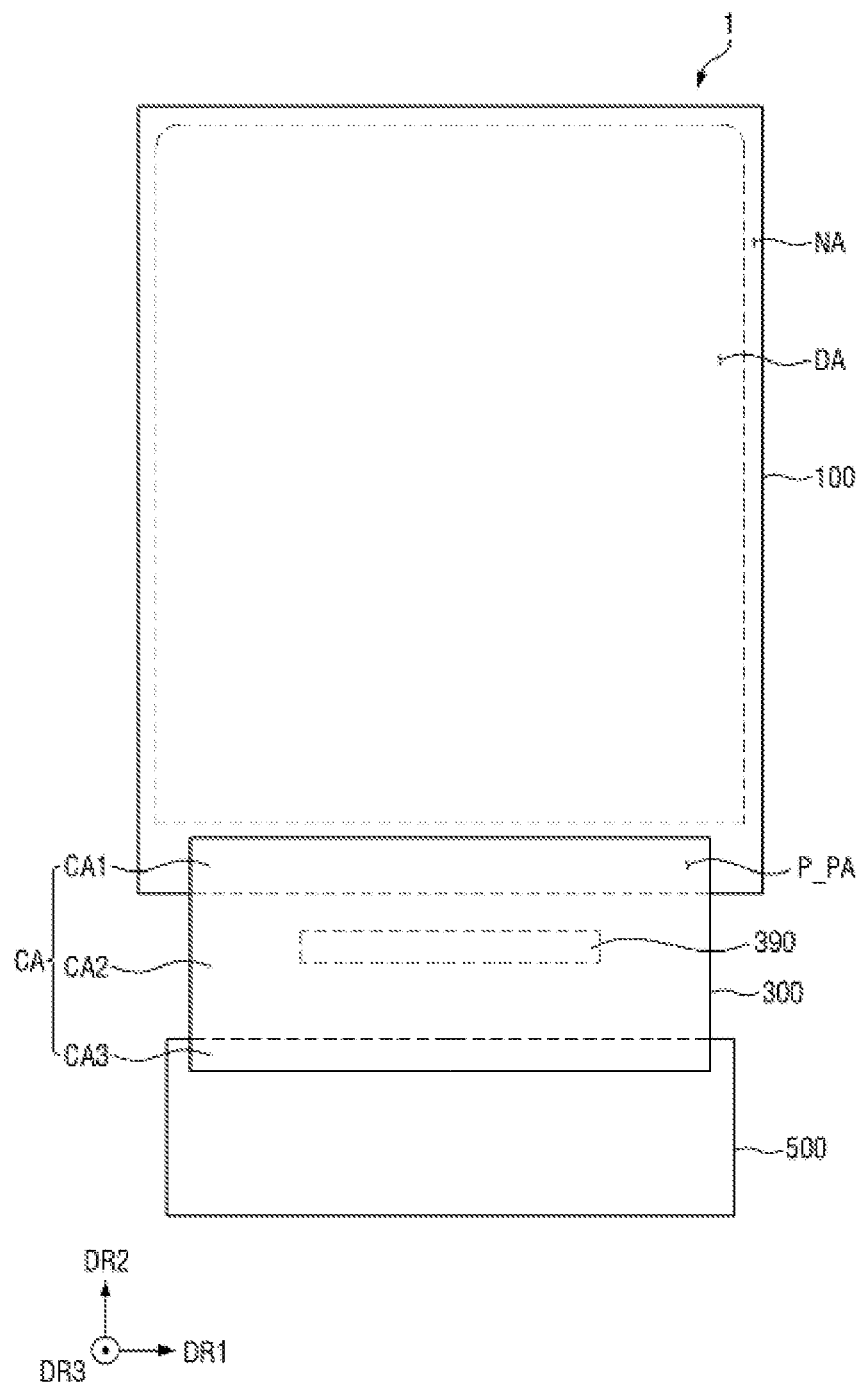
FIG. 1 is a plan layout view of a display device according to some exemplary embodiments.

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

Figure 2:
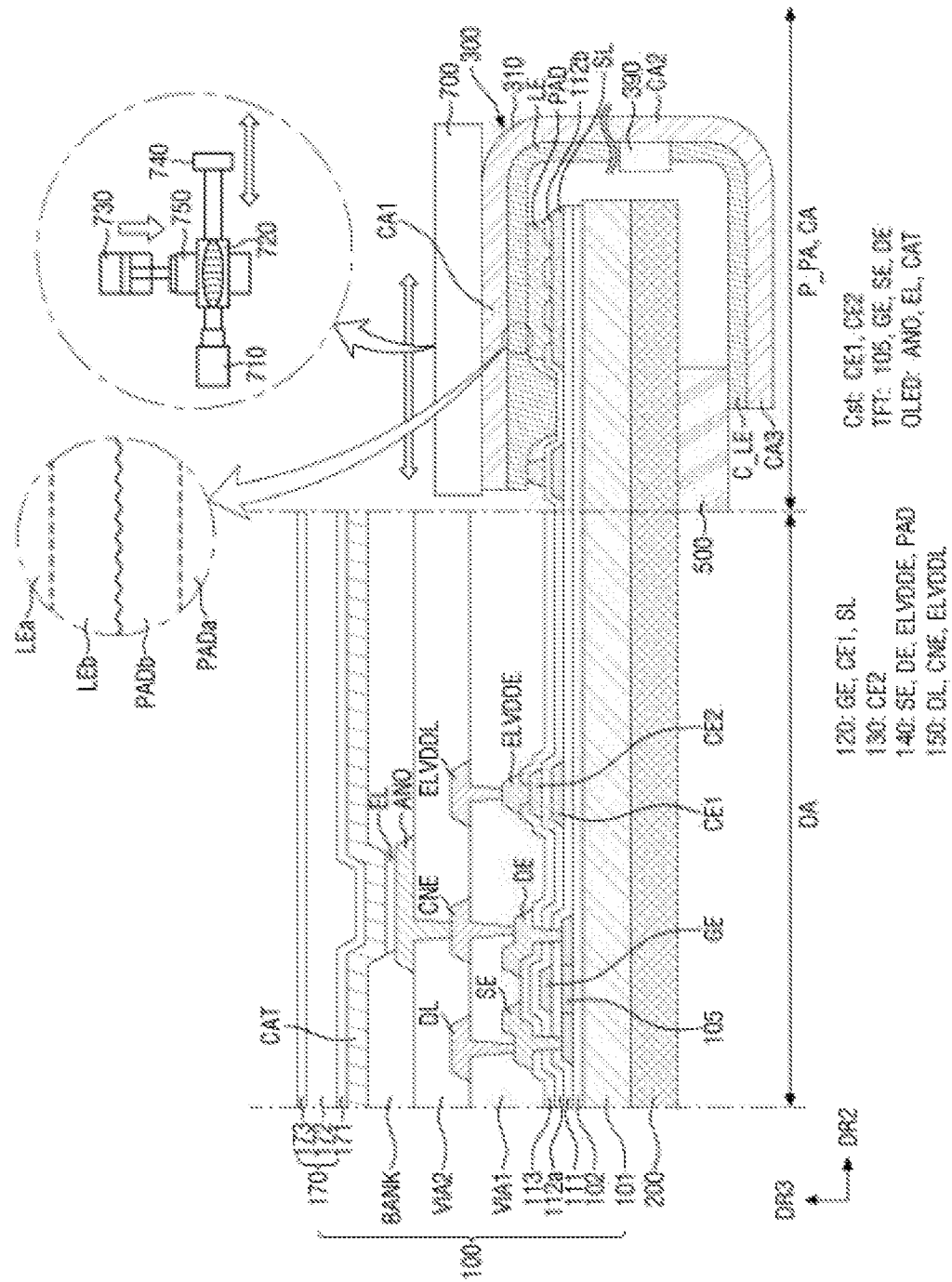
FIG. 2 is a partial cross-sectional view of the display device of FIG. 1 according to some exemplary embodiments.
Figure 3:
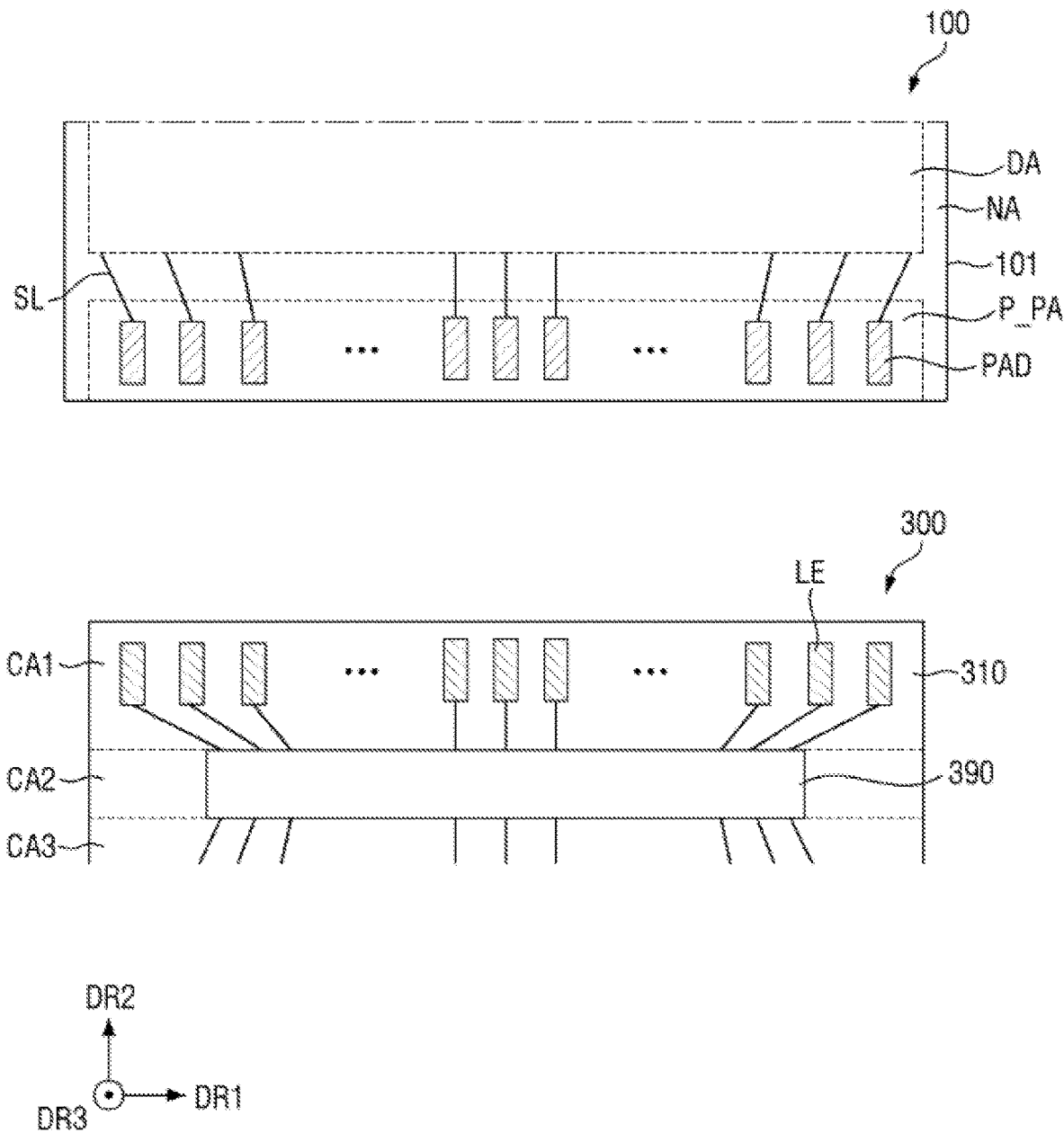
FIG. 3 is a plan layout view of a panel pad area of a display panel and a first circuit board according to some exemplary embodiments.
Figure 4:
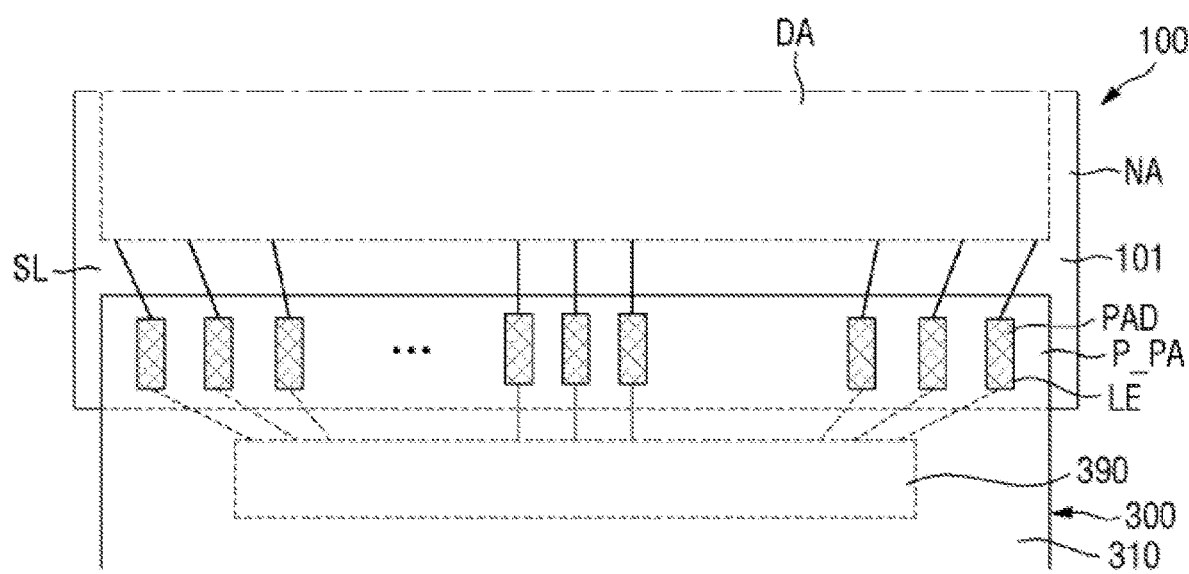
FIG. 4 is a plan layout view of a state in which a panel pad area of a display panel is attached to a flexible printed circuit board according to some exemplary embodiments.
Figure 4:
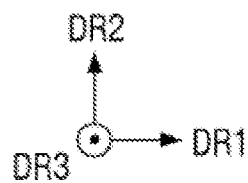
Figure 5:
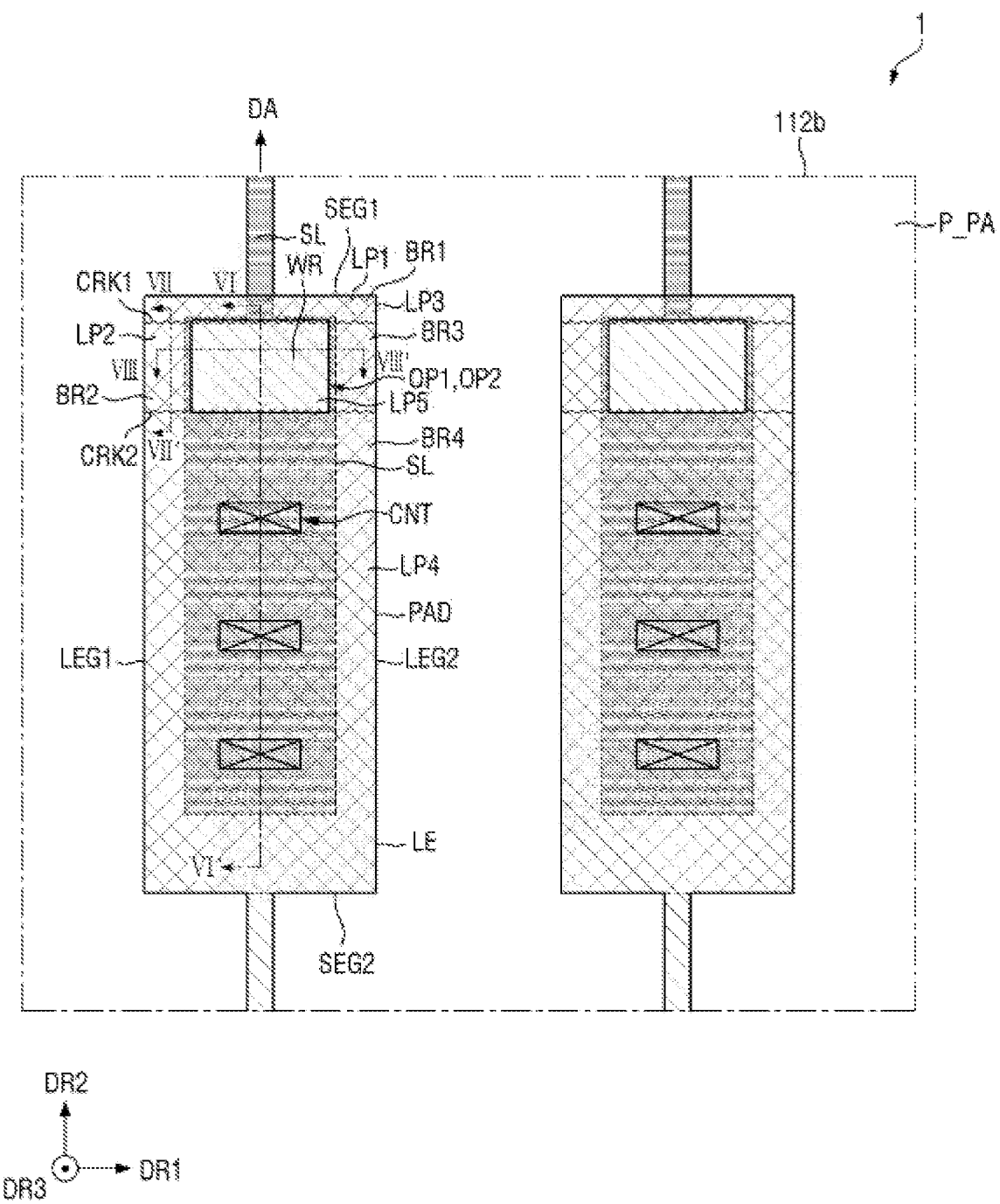
FIG. 5 is an enlarged plan view of FIG. 4 according to some exemplary embodiments.
Figure 6:
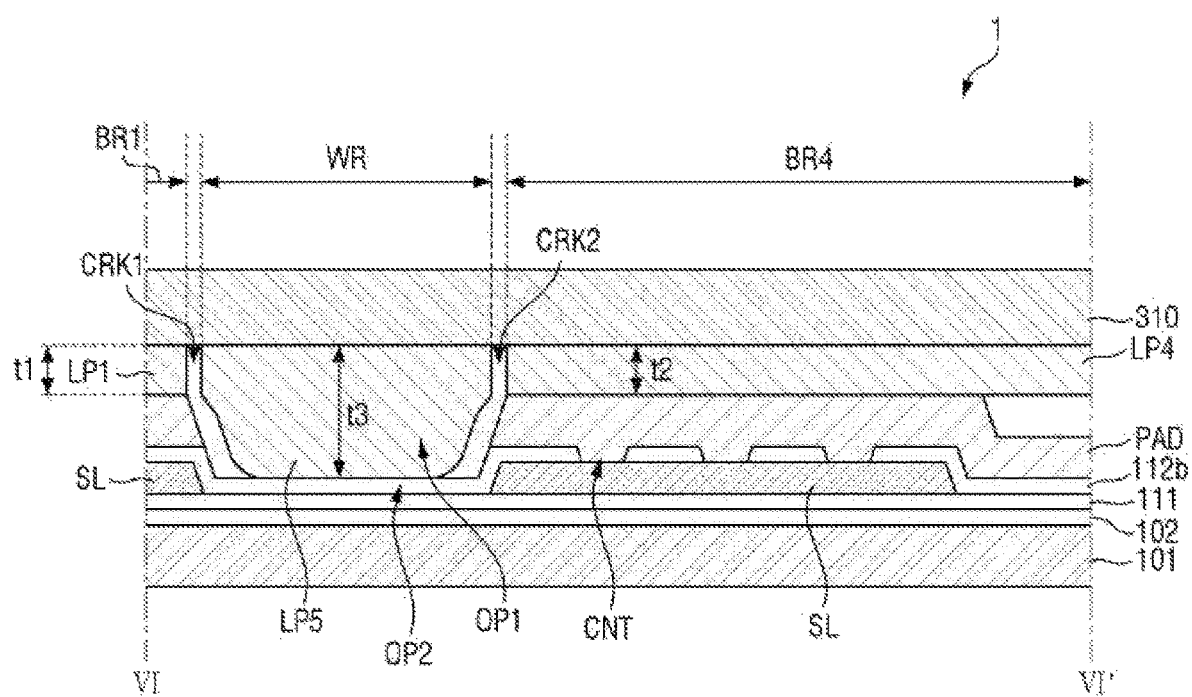
FIG. 6 is a cross-sectional view taken along sectional line VI-VI' of FIG. 5 according to some exemplary embodiments.
Figure 7:
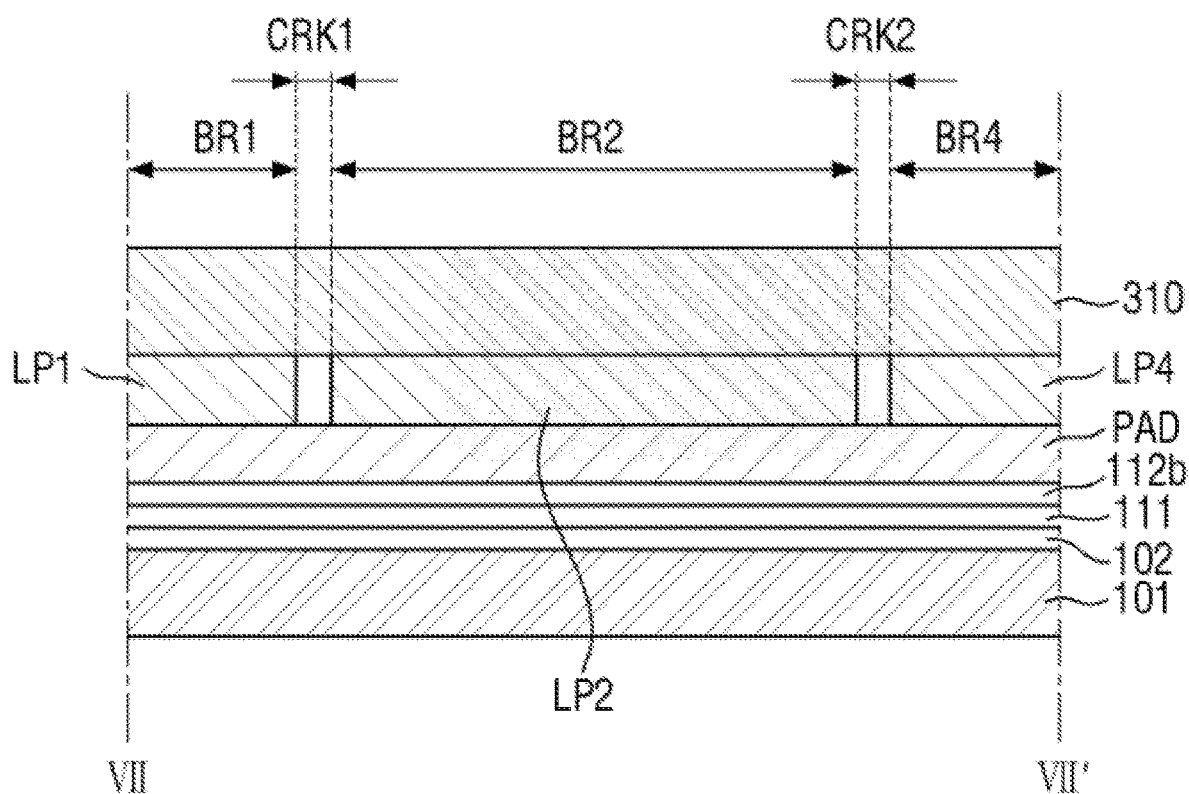
FIG. 7 is a cross-sectional view taken along sectional line VII-VII' of FIG. 5 according to some exemplary embodiments.
Figure 7:
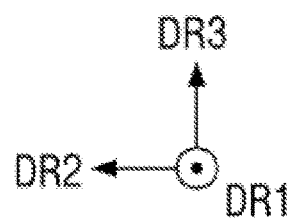
Figure 8:
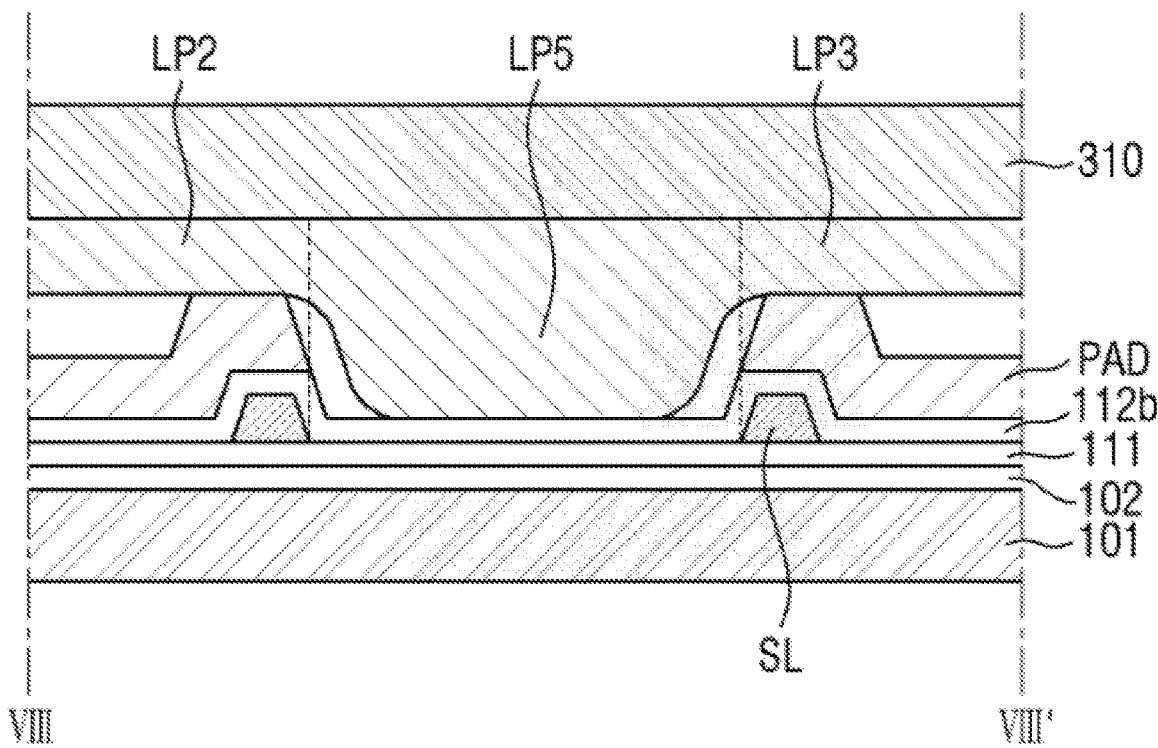
FIG. 8 is a cross-sectional view taken along sectional line VIII-VIII' of FIG. 5 according to some exemplary embodiments.
Figure 8:
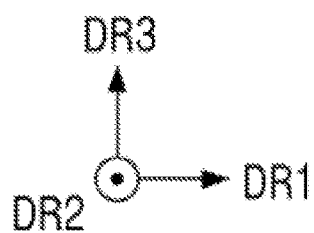

FIG. 1 is a plan layout view of a display device according to some exemplary embodiments. FIG. 2 is a partial cross-sectional view of the display device of FIG. 1 according to some exemplary embodiments. FIG. 3 is a plan layout view of a panel pad area of a display panel and a first circuit board according to some exemplary embodiments. FIG. 4 is a plan layout view of a state in which a panel pad area of a display panel is attached to a flexible printed circuit board according to some exemplary embodiments. FIG. 5 is an enlarged plan view of FIG. 4 according to some exemplary embodiments. FIG. 6 is a cross-sectional view taken along sectional line VI-VI' of FIG. 5 according to some exemplary embodiments. FIG. 7 is a cross-sectional view taken along sectional line VII-VII' of FIG. 5 according to some exemplary embodiments. FIG. 8 is a cross-sectional view taken along sectional line VIII-VIII' of FIG. 5 according to some exemplary embodiments.

A display device 1, which is a device for displaying a mobile image (e.g., a video image) or a still image, may be used as a display screen of various products, such as televisions, notebooks, monitors, billboards, and internet-of-things (IOT) devices, as well as portable electronic appliances, such as mobile phones, smart phones, tablet personal computers (PCs), smart watches, watch phones, mobile communication terminals, electronic notebooks, electronic books, portable multimedia players (PMPs), navigation units, ultra-mobile PCs, etc.

Referring to FIGS. 1 to 9, the display device 1 may include a display panel 100 for displaying an image, a first circuit board 300 connected to the display panel 100, and a second circuit board 500 connected to the first circuit board 300.

As the display panel 100, for example, an organic light-emitting display panel may be applied. For descriptive and illustrative convenience, exemplary embodiments will, herein, be described in association with cases in which an organic light-emitting display panel is applied as the display panel 100, but exemplary embodiments are not limited thereto. For instance, various kinds of display panels, such as a liquid crystal display panel (LCD), a quantum dot organic light-emitting display panel (QD-OLED), a quantum dot liquid crystal display panel (QD-LCD), a quantum nano-emitting display panel (QNED), a micro LED, etc., may be applied.

The display panel 100 includes a display area DA including a plurality of pixel areas and a non-display area NA disposed outside, e.g., around, the display area DA. A plurality of thin film transistors (TFTs) may be arranged in the display area DA.

The display area DA may have a rectangular shape having angular corners or a rectangular shape having rounded corners. The display area DA may have short sides and long sides. The short sides of the display area DA may be sides extending in a first direction DR1. The long sides of the display area DA may be sides extending in a second direction DR2. It is, however, contemplated that the planar shape of the display area DA is not limited to a rectangular shape, and may be any suitable shape, such as a circular shape, an elliptical shape, or any other suitable shape. The non-display area NA may be disposed adjacent to both short sides and both long sides of the display area DA. In this case, the non-display area NDA may surround all sides of the display area DA, and may constitute a frame of the display area DA. It is noted, however, that exemplary embodiments are not limited thereto. For instance, the non-display area NA may be disposed adjacent to only both short sides or both long sides of the display area DA, or in any other suitable arrangement.

The non-display area NA of the display panel 100 includes a panel pad area P_PA. The panel pad area P_PA may be disposed, for example, along (or around) one short side of the display area DA. However, exemplary embodiments are not limited thereto. For instance, the panel pad area P_PA may be disposed along both short sides of the display area DA or may be disposed along both short sides and both long sides of the display area DA.

The first circuit board 300 may include a printed base film 310 and a driving integrated circuit 390 disposed on the printed base film 310. The printed base film 310 may include an insulating material.

The first circuit board 300 may include one or more circuit areas CA, such as a first circuit area CA1 whose one side is attached to the panel pad area P_PA of the display panel 100, a second circuit area CA2 disposed at one side of the first circuit area CA1 in the second direction DR2, and a third circuit area CA3 disposed at one side of the second circuit area CA2 in the second direction DR2 and attached to the second circuit board 500. The driving integrated circuit 390 may be disposed on one surface of the second circuit area CA2 of the first circuit board 300. The driving integrated circuit 390 may be, for example, a data driving integrated circuit, and a chip-on-film (COF) implemented by a data driving chip may be applied as the driving integrated circuit 390.

The second circuit board 500 may include a circuit pad area attached to the third circuit area CA3 of the first circuit board 300. A plurality of circuit pads may be arranged in the circuit pad area of the second circuit board 500 to be connected to lead wirings arranged in the third circuit area CA3 of the first circuit board 300.

Referring to FIG. 2, the display device 1 further includes a panel lower sheet 200 disposed under the display panel 100. The panel lower sheet 200 may be attached to the back surface of the display panel 100. The panel lower sheet 200 includes at least one functional layer. The functional layer may be a layer that performs at least one of a heat radiation function, an electromagnetic wave blocking function, a grounding function, a buffering function, a strength enhancement function, a supporting function, and a digitizing function. The functional layer may be at least one of a sheet layer, a film layer, a thin film layer, a coating layer, a panel, and a plate. One functional layer may be formed as a single layer, but may also be formed as a plurality of laminated thin films or coating layers. The functional layer may be, for example, a supporting substrate, a heat radiation layer, an electromagnetic wave blocking layer, an impact absorbing layer, a digitizer, and/or the like.

The first circuit board 300 may be bent downward in a third direction DR3 as shown in FIG. 2. The other side of the first circuit board 300 and the second circuit board 500 may be located under the panel lower sheet 200. The lower surface of the panel lower sheet 200 may be attached to the second circuit board 500 through an adhesive layer, but exemplary embodiments are not limited thereto.

The display panel 100 may include a display substrate 101, a plurality of conductive layers, and a plurality of insulating layers insulating the plurality of conductive layers, and an organic layer EL.

The display substrate 101 may be disposed over the entire display area DA and non-display area NA. The display substrate 101 may function to support several overlying elements. In some exemplary embodiments, the display substrate 101 may be a rigid substrate including a rigid material, such as glass, soft glass, quartz, etc. However, exemplary embodiments are not limited thereto. For instance, the display substrate 101 may be a flexible substrate including a flexible material, such as polyimide (PI).

A buffer layer 102 may be disposed on the display substrate 101. The buffer layer 102 may prevent (or at least reduce) the penetration of moisture and/or oxygen from the outside through the display substrate 101. The buffer layer 102 may include at least one of a silicon nitride ($SiN_x$) film, a silicon oxide ($SiO_2$) film, and an oxynitride ($SiO_xN_y$) film.

A semiconductor layer 105 may be disposed on the buffer layer 102. The semiconductor layer 105 forms a channel of a thin film transistor. The semiconductor layer 105 may be disposed in each pixel in the display area DA, and, in some cases, may also be disposed in the non-display area NA. The semiconductor layer 105 may include a source/drain region and an active region. The semiconductor layer 105 may include, for example, polycrystalline silicon.

A first insulating layer 111 may be disposed on the semiconductor layer 105. The first insulating layer 111 may be disposed over the entire surface of the display substrate 101. The first insulating layer 111 may be a gate insulating film having a gate insulating function. The first insulating layer 111 may include a silicon compound or a metal oxide. For example, the first insulating layer 111 may include at least one of silicon oxide, silicon nitride, silicon oxynitride, aluminum oxide, tantalum oxide, hafnium oxide, zirconium oxide, and titanium oxide. These compounds may be used alone or at least some of the aforementioned compounds may be used in combination with each other.

A first conductive layer 120 may be disposed on the first insulating layer 111. The first conductive layer 120 may include a gate electrode GE of a thin film transistor TFT, a first electrode CE1 of a storage capacitor Cst, and a connection wiring SL. The connection wiring SL may be disposed over the display area DA and the panel pad area P_PA. The connection wiring SL may be connected to the thin film transistor TFT disposed in the display area PA. That is, a signal wiring to be described later may be electrically connected to the thin film transistor TFT through the connection wiring SL.

The first conductive layer 120 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu), or an alloy of at least one of the aforementioned materials. The first conductive layer 120 may be a single film or a laminated film (e.g., multiple layers) made of at least one of the aforementioned materials.

Second insulating layers 112a and 112b may be disposed on the first conductive layer 120. The second insulating layers 112a and 112b may insulate the first conductive layer 120 from a second conductive layer 130. The second insulating layer 112a may be disposed substantially in the display area DA, and the second insulating layer 112b may be disposed substantially in the panel pad area P_PA. The second insulating layers 112a and 112b may include a material selected from the exemplified materials of the first insulating layer 111. In the panel pad area P_PA, the second insulating layer 112b may include a plurality of contact holes CNT partially exposing the connection wiring SL. Although it is illustrated in FIG. 2 that the second insulating layer 112b includes three contact holes CNT, exemplary embodiments are not limited thereto. For instance, the second insulating layer 112b may include two or less contact holes CNT or four or more contact holes CNT.

The materials included in the buffer layer 102, the first insulating layer 111, and the second insulating layers 112a and 112b may be optically transparent. As will be discussed in more detail later, the buffer layer 102, the first insulating layer 111, and the second insulating layers 112a and 112b may be laminated on a window portion of the panel pad area P_PA.

The second conductive layer 130 may be disposed on the second insulating layers 112a and 112b. The second conductive layer 130 may include a second electrode CE2 of the storage capacitor Cst. The material of the second conductive layer 130 may be selected from the exemplified materials of the first conductive layer 120. The first electrode CE1 of the storage capacitor Cst and the second electrode CE2 of the storage capacitor Cst may form a capacitor through (or with) the second insulating layers 112a and 112b.

A third insulating layer 113 may be disposed on the second conductive layer 130. The third insulating layer 113 may include at least one of the exemplified materials of the first insulating layer 111. In some exemplary embodiments, the third insulating layer 113 may include an organic insulating material. The organic insulating material may be selected from exemplified materials of a first via layer VIA1 to be described later.

A third conductive layer 140 may be disposed on the third insulating layer 113. The third conductive layer 140 may include a source electrode SE, a drain electrode DE, a high-potential voltage electrode ELVDDE, and a signal wiring PAD. The third conductive layer 140 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu), or an alloy including at least one of the aforementioned metal materials. The third conductive layer 140 may be a single film made of the above-exemplified material; however, exemplary embodiments are not limited thereto. For instance, the third conductive layer 140 may be a laminated film. For example, the third conductive layer 140 may have a laminate structure of Ti/Al/Ti, Mo/Al/Mo, Mo/AlGe/Mo, or Ti/Cu.

The signal wiring PAD of the third conductive layer 140 may be disposed to overlap the connection wiring SL of the first conductive layer 120 in a thickness direction (e.g., in the third direction DR3), and may be electrically connected to the connection wiring SL through the contact hole CNT of (or in) the second insulating layer 112b.

A first via layer VIA1 may be disposed on the third conductive layer 140. The first via layer VIA1 may include an organic insulating material. The organic insulating material may include at least one of an acrylic resin, an epoxy resin, a phenolic resin, a polyamide resin, a polyimide resin, an unsaturated polyester resin, a polyphenylene resin, a polyphenylene sulfide resin, and benzocylco butane (BCB).

Upper structures of the third insulating layer 113 and the third conductive layer 140 may be removed or omitted in a part of (or associated with) the signal wiring PAD on the panel pad area P_PA. In this manner, the omitted or removed structures may expose the signal wiring PAD disposed in the panel pad area P_PA, and the upper surface of the exposed signal wiring PAD may be coupled with the lead wiring LE of the first circuit board 300.

The first circuit board 300 further includes a lead wiring LE on one surface of the first circuit area CA1 of the printed base film 310 and a circuit lead wiring C_LE on one surface of the third circuit area CA3 of the printed base film 310. The lead wiring LE is connected to the signal wiring PAD. In some exemplary embodiments, the lead wiring LE may be directly connected to the upper surface of the exposed signal wiring PAD. For example, the lead wiring LE may be ultrasonically bonded to the signal wiring PAD.

Each of the lead wiring LE and the circuit lead wiring C_LE may include a metal material. The material included in each of the lead wiring LE and the circuit lead wiring C_LE may be at least one selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu), or an alloy of at least one of the aforementioned metal materials.

The ultrasonic bonding may be performed through an ultrasonic device 700. The ultrasonic device 700 may include a vibration generation unit 710, a vibration unit 720 connected to the vibration generation unit 710, a pressing unit 730 amplifying the amplitude of the vibration unit 720, a vibration transmission unit 740 connected to the vibration unit 720, and a supporting unit 750 supporting at least the vibration unit 720.

The vibration generation unit 710 may convert electrical energy into vibration energy. The vibration unit 720 may vibrate with the vibration energy converted by the vibration generation unit 710. The vibration unit 720 may vibrate with a predetermined vibration direction and a predetermined amplitude. The vibration unit 720 may amplify the amplitude in a direction parallel to the vibration direction through the pressing unit 730 connected to the vibration unit 720. The vibration transmission unit 740 may transmit the vibration of the vibration unit 720 to an ultrasonic bonding target. The supporting unit 750 may fix the upper surface and lower surface of the vibration unit 720 to prevent the vibration unit 720 and the vibration transmission unit 740 from being moved up and down by the vibration.

The ultrasonic device 700 is configured such that the vibration transmission unit 740 effectively transmits the vibration to the first circuit board 300 while maintaining a constant pressurized state of the first circuit board 300 in contact with the other surface of the first circuit board 300. In this case, the vibration transmission unit 740 of the ultrasonic device 700 may be ultrasonically bonded while overlapping the entire area (or a substantial area) of the first circuit board 300 as shown in FIG. 2.

The ultrasonic device 700 may vibrate the lead wiring LE in a predetermined vibration direction while vibrating in the vibration direction. However, in this case, the signal wiring PAD may be slightly vibrated in the vibration direction by the vibration transmitted through the lead wiring LE, but the vibration width thereof may be negligible. Therefore, the vibration width in the vibration direction of the vibration transmission unit 740 may be regarded as substantially the same as the distance in which the lead wiring LE has moved (or moves) in the vibration direction on the signal wiring PAD. The vibration direction may be in the second direction DR2. That is, the vibration direction may be a direction in which the long sides of the signal wiring PAD and the lead wiring LE extend.

When the lead wiring LE is ultrasonically vibrated on one surface of the signal wiring PAD, a predetermined frictional force is generated at the interface between one surface of the signal wiring PAD and one surface of the lead wiring LE, and frictional heat may be generated due to the frictional force. When the frictional heat is sufficient to melt at least some of the material constituting the signal wiring PAD and the lead wiring LE, the pad melting region PADb of the signal wiring PAD adjacent to the lead wiring LE and the lead melting region LEb of the lead wiring LE adjacent to the signal wiring PAD may be melted. That is, the signal wiring PAD may include a pad non-melting region PADa and the pad melting region PADb. Further, the lead wiring LE may include a lead non-melting region LEa and the lead melting region LEb.

The pad non-melting region PADa may be a region including only the material included in the signal wiring PAD, and the lead non-melting region LEa may be a region containing only the material included in the lead wiring LE.

The pad melting region PADb may be a region in which the material included in the lead wiring LE is diffused, and thus, the material of the signal wiring PAD and the material of the lead wiring LE are mixed with each other, and the lead melting region LEb may be a region in which the material included in the signal wiring PAD is diffused, and thus, the material of the lead wiring LE and the material of the signal wiring PAD are mixed with each other.

In the pad melting region PADb and the lead melting region LEb, the signal wiring PAD and the lead wiring LE may be coupled with each other through solidification. The interface between the signal wiring PAD and the lead wiring LE, that is, the interface between the pad melting region PADb and the lead melting region LEb, may have a non-flat shape.

According to some exemplary embodiments, the panel pad area P_PA may further include a window portion. The window portion refers to a region where the openings of the signal wiring PAD and the connection wiring SL are disposed as will be described later. The first circuit board 300 is attached to the panel pad area P_PA of the display panel 100 through the aforementioned ultrasonic bonding process, and provides a region for inspecting the attachment state.

The window portion of the panel pad area P_PA is a region in which the connection wiring SL and the signal wiring PAD are not arranged and optically transparent insulating layers are laminated, whereas the peripheral regions of the planar portion of the signal wiring PAD of the panel pad area P_PA other than the window portion may be an area in which the connection wiring SL, the second insulating layer 112b, and the signal wiring PAD are laminated. Thus, the regions around the window portion of the planar portion of the signal wiring PAD may have a stepped portion protruding in the thickness direction of the window portion. The stepped portion may cause cracks in the lead wiring LE during the ultrasonic process of the signal wiring PAD and the lead wiring LE. These cracks may be a factor that interferes with the smooth transmission of external signals through the lead wiring LE. Details thereof will be described later.

A fourth conductive layer 150 may be disposed on the first via layer VIA1. The fourth conductive layer 150 may include a data line DL, a connection electrode CNE, and a high-potential voltage wiring ELVDDL. The data line DL may be electrically connected to the source electrode SE of the thin film transistor TFT through a contact hole penetrating the first via layer VIA1. The connection electrode CNE may be electrically connected to the drain electrode DE of the thin film transistor TFT through a contact hole penetrating the first via layer VIA1. The high-potential voltage wiring ELVDDL may be electrically connected to the high-potential voltage electrode ELVDDE through a contact hole penetrating the first via layer VIA1. The fourth conductive layer 150 may include a material selected from the exemplified materials of the third conductive layer 140.

A second via layer VIA2 is disposed on the fourth conductive layer 150. The second via layer VIA2 may include at least one of the exemplified materials of the first via layer VIA1.

An anode electrode ANO is disposed on the second via layer VIA2. The anode electrode ANO may be electrically connected to the connection electrode CNE through a contact hole penetrating the second via layer VIA2.

A bank layer BANK may be disposed on the anode electrode ANO. The bank layer BANK may include a contact hole exposing the anode electrode ANO. The bank layer BANK may include an organic insulating material or an inorganic insulating material. For example, the bank layer BANK may include at least one of a photoresist, a polyimide resin, an acrylic resin, a silicone compound, and a polyacrylic resin.

An organic layer EL may be disposed on the upper surface of the anode electrode ANO and in the opening of the bank layer BANK. A cathode electrode CAT is disposed on the organic layer EL and the bank layer BANK. The cathode electrode CAT may be a common electrode disposed over a plurality of pixels.

A thin film encapsulation layer 170 is disposed on the cathode electrode CAT. The thin film encapsulation layer 170 may cover an organic light-emitting element OLED, which may include the anode electrode ANO, the organic layer EL, and the cathode electrode CAT. The thin film encapsulation layer 170 may be a laminated film in which one or more inorganic films and one or more organic films are alternately laminated. For example, the thin film encapsulation layer 170 may include a first encapsulation inorganic film 171, an encapsulation organic film 172, and a second encapsulation inorganic film 173 which are sequentially laminated.

According to some exemplary embodiments, a laminated structure and shape of the connection wiring SL and the signal wiring PAD in the panel pad area P_PA may be deformed. For example, in some exemplary embodiments, the connection wiring SL may include a plurality of patterns, and the signal wiring PAD disposed on the connection wiring SL may have surface unevenness in consideration of the stepped portion of the patterns of the connection wiring SL.

In some exemplary embodiments, an auxiliary signal wiring of the second conductive layer 130 may be further disposed between the connection wiring SL and the signal wiring PAD. In this case, the planar size of the auxiliary signal wiring may be smaller than the planar size of the signal wiring PAD. The signal wiring PAD, the auxiliary signal wiring, and the connection wiring SL may overlap each other in the thickness direction, and may be electrically connected to each other. Further, in some exemplary embodiments, the connection wiring SL may be composed of the second conductive layer 130, and the signal wiring PAD may be composed of the fourth conductive layer 150.

Referring to FIG. 3, a plurality of signal wirings PAD may be arranged in the first direction DR1. The plurality of signal wirings PAD may include, for example, a power supply pad, a data pad, and a panel dummy pad. The second direction DR2 may be a direction from the end of the panel pad area P_PA toward the display area DA. The first direction DR1 refers to a direction crossing the second direction DR2.

The signal wiring PAD may be substantially rectangular in a plan view, e.g., when viewed in the third direction DR3. The signal wiring PAD may be provided therein with an opening as will be described later. The signal wiring PAD may serve to output an external signal applied through the lead wiring LE to the thin film transistor TFT of the display area DA.

A plurality of lead wirings LE may be arranged in the first circuit area CA1, and may be arranged in the first direction DR1. The plurality of lead wirings LE may include a power lead wiring, a data lead wiring, and a dummy lead. The planar shape of the lead wiring LE may be a rectangular shape. The lead wiring LE may serve to transfer the external signal applied from the driving integrated circuit 390 to the signal wiring PAD.

Referring to FIG. 4, the plurality of signal wirings PAD may be connected to the plurality of lead wirings LE. For example, the signal wiring PAD may be directly connected to the lead wiring LE, and the signal wiring PAD and the lead wiring LE may be ultrasonically bonded to each other. The first circuit area CA1 of FIG. 4, inverted by 180°, is attached to the panel pad area P_PA of FIG. 3 in the thickness direction. The lead wiring LE may be disposed to substantially overlap the signal wiring PAD in the thickness direction. However, the lead wiring LE may be disposed not to overlap the opening of the signal wiring PAD in the thickness direction, as will be become more apparent below.

Referring to FIGS. 5 to 9, the signal wiring PAD in the panel pad area P_PA may include a window portion WR, first to fourth bonding portions BR1 to BR4 arranged around the window portion WR, and first and second crack portions CRK1 and CRK2 arranged in the window portions WR and the first to fourth bonding portions BR1 to BR4 in the plane of the signal wiring PAD. As described above, the window portion WR may be a region for inspecting an attachment state after the ultrasonic bonding process of the lead wirings LE of the first circuit board 300 and the signal wirings PAD of the panel pad area P_PA of the display panel 100, the first to fourth bonding portions BR1 to BR4 may be regions where the signal wirings PAD are directly connected to the lead wirings LE, and the crack portions CK1 and CK2 may regions where cracks are generated in the lead wirings LE.

The window portion WR of the panel pad area P_PA may be disposed in the signal wiring PAD and the connection wiring SL in a plan view. The planar shape of the window portion WR may be rectangular as shown in FIG. 5. In some exemplary embodiments, the planar shape of the window portion WR may be square, circular, elliptical, or polygonal. Hereinafter, a case where a rectangle is applied to (or as) the planar shape of the window portion WR will be mainly described. The window portion WR may include long sides extending in the second direction DR2 and short sides extending in the first direction DR1. The window portion WR may be provided with a first opening OP1 of the signal wiring PAD and a second opening OP2 of the connection wiring SL. The planar shape of each of the first opening OP1 and the second opening OP2 may be substantially the same as the planar shape of the panel pad area P_PA; however, exemplary embodiments are not limited thereto.

Referring to FIGS. 5 and 6, in the window portion WR, the display substrate 101, optically transparent insulating layers 102, 111, and 112b, and a lead wiring LE are laminated, and in the regions around the window portion WR of the signal wiring PAD, a buffer layer 102, a first insulating layer 111, a connection wiring SL, a second insulating layer 112b, a signal wiring PAD, and a lead wiring LE may be laminated. As such, a stepped portion occurs between the window portion WR and the regions around the window portion WR of the signal wiring PAD. Due, at least in part, to the stepped portion, the crack portions CK1 and CK2 may be formed in the lead wiring LE.

As shown in FIG. 5, the first and second crack portions CRK1 and CRK2 of the panel pad area P_PA may be formed along the long sides of the window portion WR. The first crack portion CRK1 may be disposed closer to the display area DA than the second crack portion CRK2. The first and second crack portions CRK1 and CRK2 may have a shape crossing the long sides of the lead wiring LE in a plan view. As described with reference to FIG. 2, since the vibration direction of the ultrasonic device 700 is a direction in which the long sides of the signal wiring PAD and the lead wiring LE extend, cracks may be formed around the window portion WR due to the lower stepped portion of the lead wiring LE during an ultrasonic bonding process, and the formed cracks gradually progress along the extending direction of the long sides of the window portion WR during the ultrasonic bonding process and/or when using the display device 1 to have a shape intersecting, e.g., completely intersecting, the long sides of the lead wiring LE.

In the planar portion of the signal wiring PAD of the panel pad area P_PA, the portions other than the window portion WR and the first and second crack portions CRK1 and CRK2 may be the first to fourth bonding portions BR1 to BR4. The first bonding portion BR1 may be located at the upper end of the first crack portion CRK1 in a plan view, the second bonding portion BR2 may be located at the left end of the window portion WR in a plan view, the third bonding portion BR3 may be located at the right end of the window portion WR in a plan view, and the fourth bonding portion BR4 may be located at the lower end of the second crack portion CRK2 in a plan view. A plurality of contact holes CNTs of the second insulating layer 112b may be arranged in the fourth bonding portion BR4.

As described above, the connection wiring SL may be disposed over the panel pad area P_PA and the display area DA. The connection wiring SL may have a shape in which its width is increased in the first direction DR1 in an area overlapping the signal wiring PAD of the panel pad area P_PA. The connection wiring SL may be disposed in the first to fourth bonding portions BR1 to BR4 and first and second crack portions CRK1 and CRK2 of the panel pad area P_PA.

The connection wiring SL may include a second opening OP2 at least surrounded by the connection wiring SL. The second opening OP2 may include a second through-hole completely surrounded by the connection wiring SL and penetrating the connection wiring SL from the surface of the connection wiring SL. The connection wiring SL may be provided with the first crack portion CRK1 located at the upper end of the window portion WR in a plan view, the second crack portion CRK2 disposed in the first bonding portion BR1 and located at the lower end of the window portion WR in a plan view, the fourth bonding portion BR4, the second bonding portion BR2 located at the left end of the window portion WR in a plan view, and the third bonding portion BR3 located at the right end of the window portion WR in a plan view.

The width of the connection wiring SL in the first direction DR1 in the first bonding portion BR1, the first crack portion CRK1, the fourth bonding portion BR4, and the second crack portion CRK2 may be greater than the width of the connection wiring SL in the first direction DR1 in the second bonding portion BR2 and the third bonding portion BR3. The connection wiring SL may be integrally formed in a plan view as shown in FIG. 5.

The signal wiring PAD may be disposed on the connection wiring SL, and the width of the signal wiring PAD in the first direction DR1 in a plan view may be greater than the width of the connection wiring SL in the first direction DR1 in a plan view. The signal wiring PAD may be disposed in the first to fourth bonding portions BR1 to BR4 of the panel pad area P_PA and the first and second crack portions CRK1 and CRK2.

The signal wiring PAD may include a first opening OP1 at least surrounded by the signal wiring PAD. The first opening OP1 may include a first through-hole completely surrounded by the signal wiring PAD and penetrating the signal wiring PAD from the surface of the signal wiring PAD. The first opening OP1 may be disposed to overlap the second opening OP2 of the connection wiring SL. The signal wiring PAD may be provided with the first crack portion CRK1 located at the upper end of the window portion WR in a plan view, the second crack portion CRK2 disposed in the first bonding portion BR1 and located at the lower end of the window portion WR in a plan view, the fourth bonding portion BR4, the second bonding portion BR2 located at the left end of the window portion WR in a plan view, and the third bonding portion BR3 located at the right end of the window portion WR in a plan view.

The width of the signal wiring PAD in the first direction DR1 in the first bonding portion BR1, the first crack portion CRK1, the fourth bonding portion BR4 and the second crack portion CRK2 may be greater than the width of the signal wiring PAD in the first direction in the second bonding portion BR2 and the third bonding portion BR3. Similarly to the connection wiring SL, the signal wiring PAD may be integrally formed in a plan view. The signal wiring PAD may be connected to the connection wiring SL through the contact hole CNT of the second insulating layer 112b in the fourth bonding portion BR4.

The lead wiring LE may be disposed on the window portion WR on the signal wiring PAD and on the first to fourth bonding portions BR1 to BR4. The lead wiring LE may include a plurality of lead patterns LP1 to LP5. That is, the first lead pattern LP1 may be disposed on the first bonding portion BR1, the second lead pattern LP2 may be disposed on the second bonding portion BR2, the third lead pattern LP3 may be disposed on the third bonding portion BR3, the fourth lead pattern LP4 may be disposed on the fourth bonding portion BR4, and the fifth lead pattern LP5 may be disposed on the window portion WR.

The first crack portion CRK1 may be disposed between the first lead pattern LP1 and the second lead pattern LP2, and between the third lead pattern LP3 and the fifth lead pattern LP5. The second crack portion CRK2 may be disposed between the second lead pattern LP2 and the third lead pattern LP3, and between the fifth lead pattern LP5 and the fourth lead pattern LP4. The first and second crack portions CRK1 and CRK2 of the panel pad area P_PA may be regions in which the lead wiring LE is not disposed to completely penetrate the surface of the lead wiring LE in the thickness direction. That is, the first lead pattern LP1 may be disposed to be separated from the second lead pattern LP2, the third lead pattern LP3, and the fifth lead pattern LP5 with the first crack portion CRK1 therebetween, and the fourth lead pattern LP4 may be disposed to be separated from the second lead pattern LP2, the third lead pattern LP3, and the fifth lead pattern LP5 with the second crack portion CRK2 therebetween. On the other hand, the second lead pattern LP2 and the fifth lead pattern LP5 may be connected to each other, and the third lead pattern LP3 and the fifth lead pattern LP5 may be connected to each other.

The lead wiring LE may have a different thickness for each region. The first to fourth lead patterns LP1 to LP4 of the lead wiring LE have substantially the same or similar thicknesses, and the fifth lead pattern LP5 of the lead wiring LE may have a larger thickness than each of the first to fourth lead patterns LP1 to LP4. For example, referring to FIG. 6, the first lead pattern LP1 may have a first thickness t1, the fourth lead pattern LP4 may have a second thickness t2, and the fifth lead pattern LP5 may have a third thickness t3. The first thickness t1 and the second thickness t2 may be substantially the same as or similar to each other, and each of the first thickness t1 and the second thickness t2 may be smaller than the third thickness t3. This phenomenon (or structure) is due to the fact that the first lead pattern LP1, the fourth lead pattern LP4, and the fifth lead pattern LP5 are formed by the movement of partially molten materials of the signal wiring PAD and the lead wiring LE to the window portion WR from the first to fourth first to fourth bonding portions BR1 to BR4 adjacent to the window portion WR.

The fourth lead pattern LP4 may be in direct contact with the second insulating layer 112b, which is exposed via at least the first opening OP1. Although it is shown in FIGS. 6 to 8 that the fourth lead pattern LP4 is not in contact with the second insulating layer 112b and the inner side surfaces of the signal wiring PAD, exemplary embodiments are not limited thereto. For instance, the fourth lead pattern LP4 may be in contact with the second insulating layer 112b and the inner side surfaces of the signal wiring PAD.

Referring back to FIG. 5, the window portion WR where the first opening OP1 of the signal wiring PAD and the second opening OP2 of the lead wiring LE may be disposed close to the display area DA. That is, the window portion WR may be located closer to the display area DA than the plurality of contact holes CNT of the second insulating layer 112b. Thus, an external signal applied through the lead wiring LE may be transmitted to the signal wiring PAD.

Figure 9:
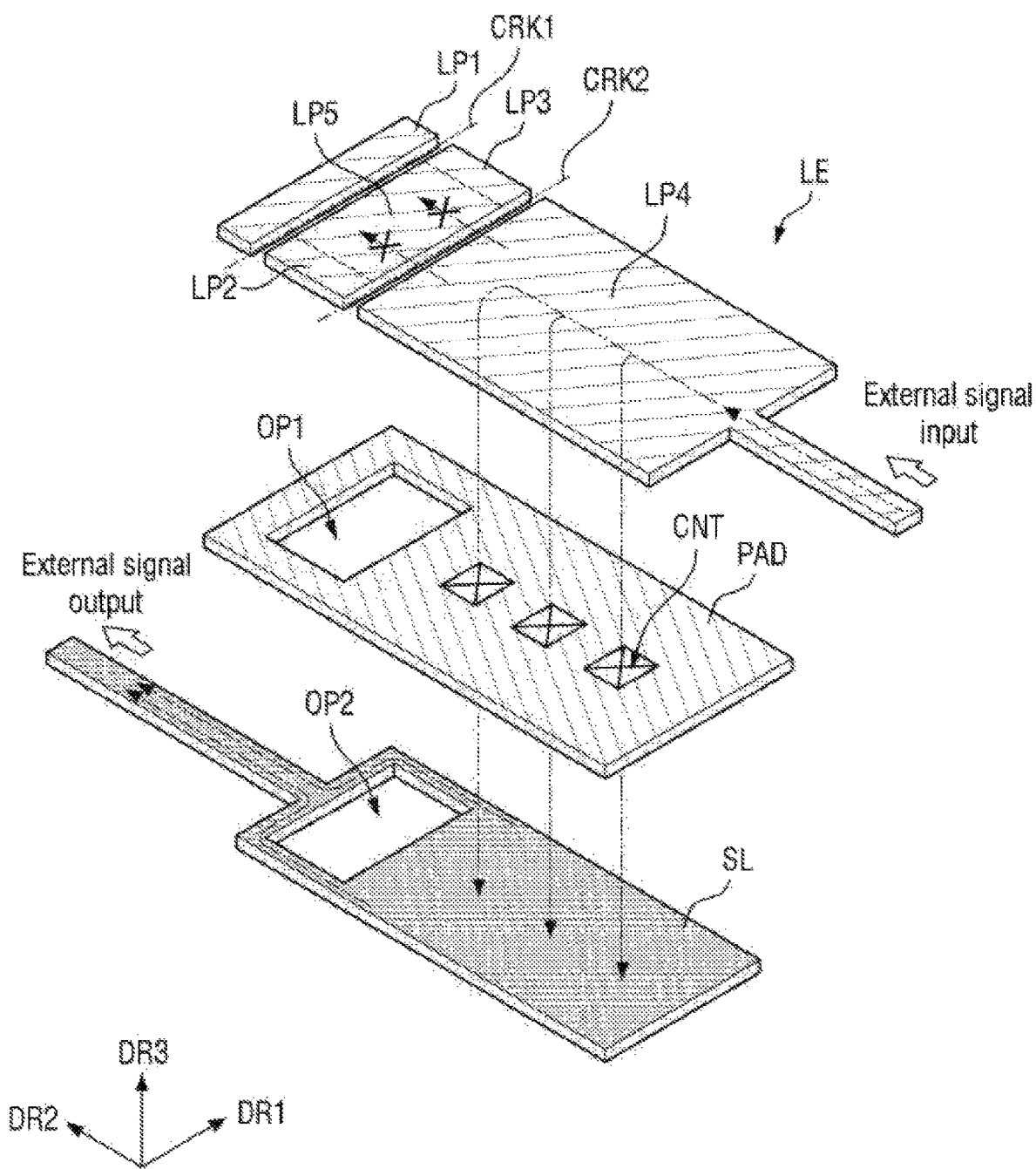
FIG. 9 is a conceptual view showing a case where an external signal is input and output through a lead wiring, a signal wiring, and a connection wiring according to some exemplary embodiments.

Referring to FIG. 9, the external signal applied through the lead wiring LE, that is, the fourth lead pattern LP4, may not be directly transmitted to the second lead pattern LP2, the third lead pattern LP3, and the fifth lead pattern LP5 through the second crack portion CRK2 disposed between the fourth lead pattern LP4 and the second lead pattern LP2, between the fourth lead pattern LP4 and the third lead pattern LP3, and between the fourth lead pattern LP4 and the fifth lead pattern LP5. That is, the external signal applied through the fourth lead pattern LP4 may be transmitted only to the underlying surface-connected signal wiring PAD without passing through the fourth lead pattern LP4 to the second lead pattern LP2, the third lead pattern LP3, and the fifth lead pattern LP5. The external signal transmitted to the underlying signal wiring PAD may be output to the display area DA through the contact holes CNT between the integrally formed signal wiring PAD and the connection wiring SL disposed under the signal wiring PAD.

As shown in FIG. 9, the external signal applied to the fourth lead pattern LP4 may, in some exemplary embodiments, be applied to the second lead pattern LP2, the third lead pattern LP3, and the fifth lead pattern LP5, which are surface-connected to the signal wiring PAD, and may be output to the display area DA again through the signal wiring PAD and the connection wiring SL, but the signal transmission time may be delayed as compared with a path in which the external signal applied to the fourth lead pattern LP4 is output through the signal wiring PAD and the connection wiring SL.

Since the signal transmission time tends to be inversely proportional to a surface connection area between the fourth lead pattern LP4 and the signal wiring PAD surface-connected to the fourth lead pattern LP4, the transmission efficiency of the external signal through the lead wiring LE and the signal wiring PAD may increase as the area occupied by the fourth lead pattern LP4 in the lead wiring LE increases.

That is, in the display device 1 according to some exemplary embodiments, the window portion WR for physically separating the lead wiring LE from the panel pad area P_PA, that is, the first and second openings OP1 and OP2 of the signal wiring PAD and the connection wiring SL may be formed closest to the display area DA, and thus, the area of the fourth lead pattern LP4 physically separated from the adjacent lead patterns LP1, LP2, LP3, and LP5 may be maximized relative to the other lead patterns LP1, LP2, LP3, and LP5, thereby increasing the transmission efficiency of the external signal through the lead wiring LE and the signal wiring PAD.

Hereinafter, display devices according to various exemplary embodiments will be described. In the following exemplary embodiments, the same components as those in the previously described exemplary embodiments will be referred to as the same reference numerals, and a description thereof will be omitted or simplified.

Figure 10:
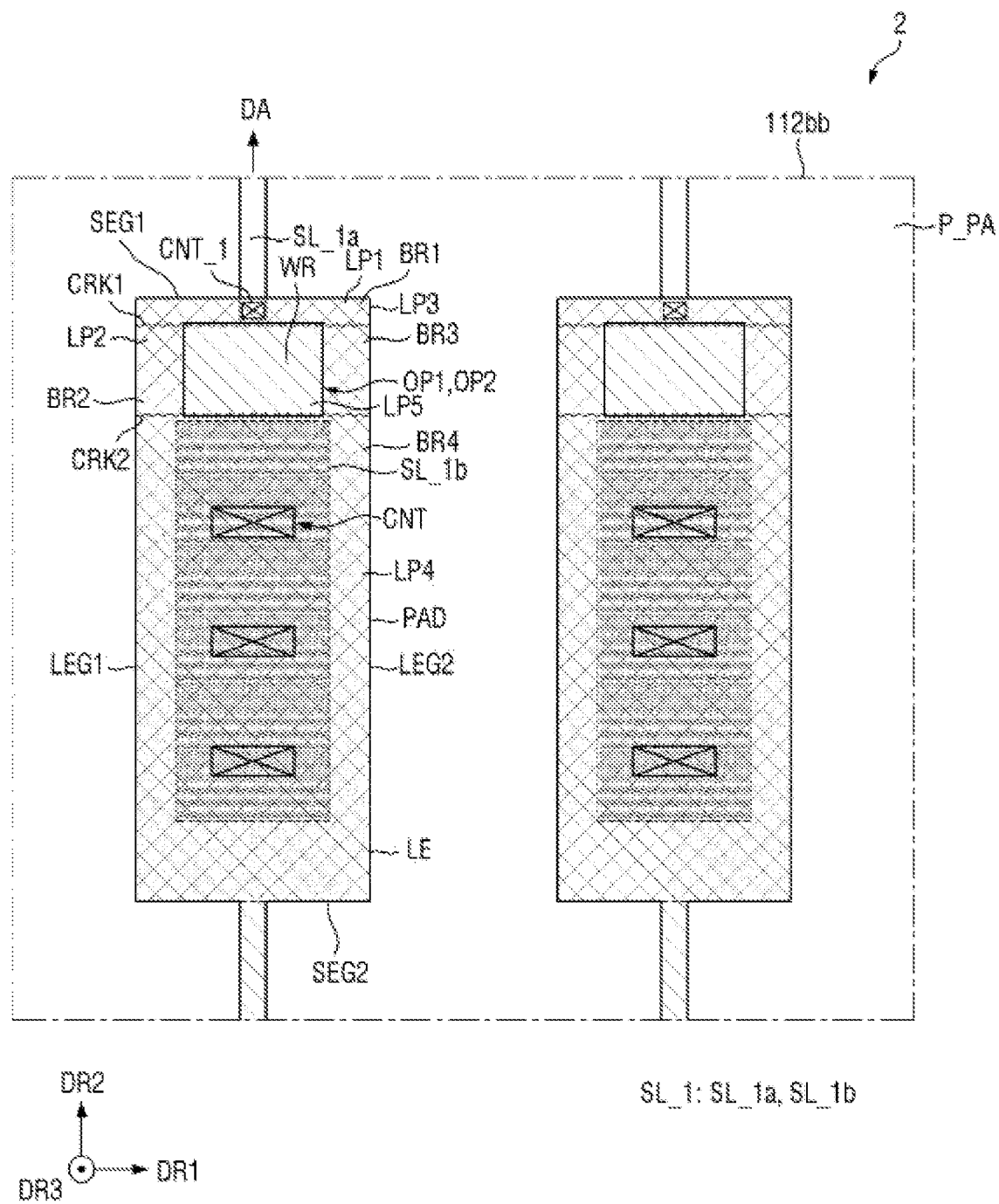
FIG. 10 is a plan layout view of a state in which a panel pad area of a display panel is attached to a flexible printed circuit board according to some exemplary embodiments.
Figure 11:
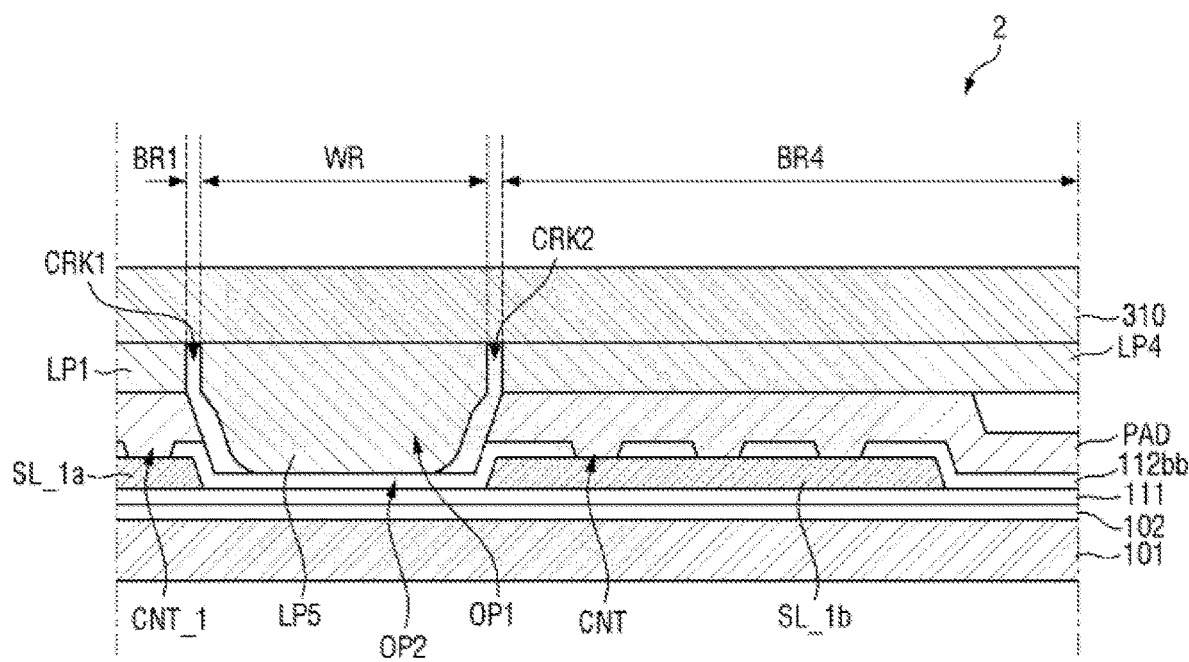
FIG. 11 is a cross-sectional view of FIG. 10 according to some exemplary embodiments.
Figure 11:
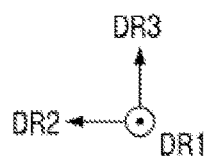

FIG. 10 is a plan layout view of a state in which a panel pad area of a display panel is attached to a flexible printed circuit board according to some exemplary embodiments. FIG. 11 is a cross-sectional view of FIG. 10 according to some exemplary embodiments.

Referring to FIGS. 10 and 11, a display device 2 according to some exemplary embodiments is different from the display device 1 of FIGS. 1-9 in that a connection wiring SL_1 includes a plurality of patterns. For instance, in the display device 2 according to some exemplary embodiments, the connection wiring SL_1 may include a first sub-connection wiring SL_1a for connecting the signal wiring PAD with the thin film transistor TFT of the display area DA and a second sub-connection wiring SL_1b substantially overlapping the signal wiring PAD and the lead wiring LE.

The first sub-connection wiring SL_1a may connect the signal wiring PAD with the thin film transistor TFT of the display area DA. That is, the first sub-connection wiring SL_1a may be disposed over the panel pad area P_PA and the display area DA. The first sub-connection wiring SL_1a may be disposed on (or in) the same layer as the connection wiring SL according to some exemplary embodiments and may include at least one of the materials of the first conductive layer 120. However, exemplary embodiments are not limited thereto. For instance, the first sub-connection wiring SL_1a may be disposed on the third conductive layer 140 according to some exemplary embodiments and may include at least one of the materials of the third conductive layer 140.

The first sub-connection wiring SL_1a may be electrically connected to the overlying signal wiring PAD through a sub-contact hole CNT_1. The second insulating layer 112bb may be further provided therein with a sub-contact hole CNT_1.

The window portion WR may be disposed between the sub-contact hole CNT_1 and the contact hole CNT in a plan view.

The second sub-connection wiring SL_1b may be disposed in the fourth bonding portion BR4 of the panel pad area P_PA and may be disposed so as not to overlap the window portion WR. Although the second sub-connection wiring SL_1b may serve to reduce the surface resistance of the signal wiring PAD of the panel pad area P_PA, unlike the connection wiring SL according to some exemplary embodiments, the second sub-connection wiring SL_1b may not directly transmit an external signal to the thin film transistor TFT of the display area DA.

Even in the display device 2 according to some exemplary embodiments, the window portion WR for physically separating the lead wiring LE from the panel pad area P_PA, that is, the opening OP1 of the signal wiring PAD may be formed closest to the display area DA, and thus, the area of the fourth lead pattern LP4 physically separated from the adjacent lead patterns LP1, LP2, LP3, and LP5 may be maximized relative to other lead patterns LP1, LP2, LP3, and LP5, thereby increasing the transmission efficiency of the external signal through the lead wiring LE and the signal wiring PAD.

Figure 12:
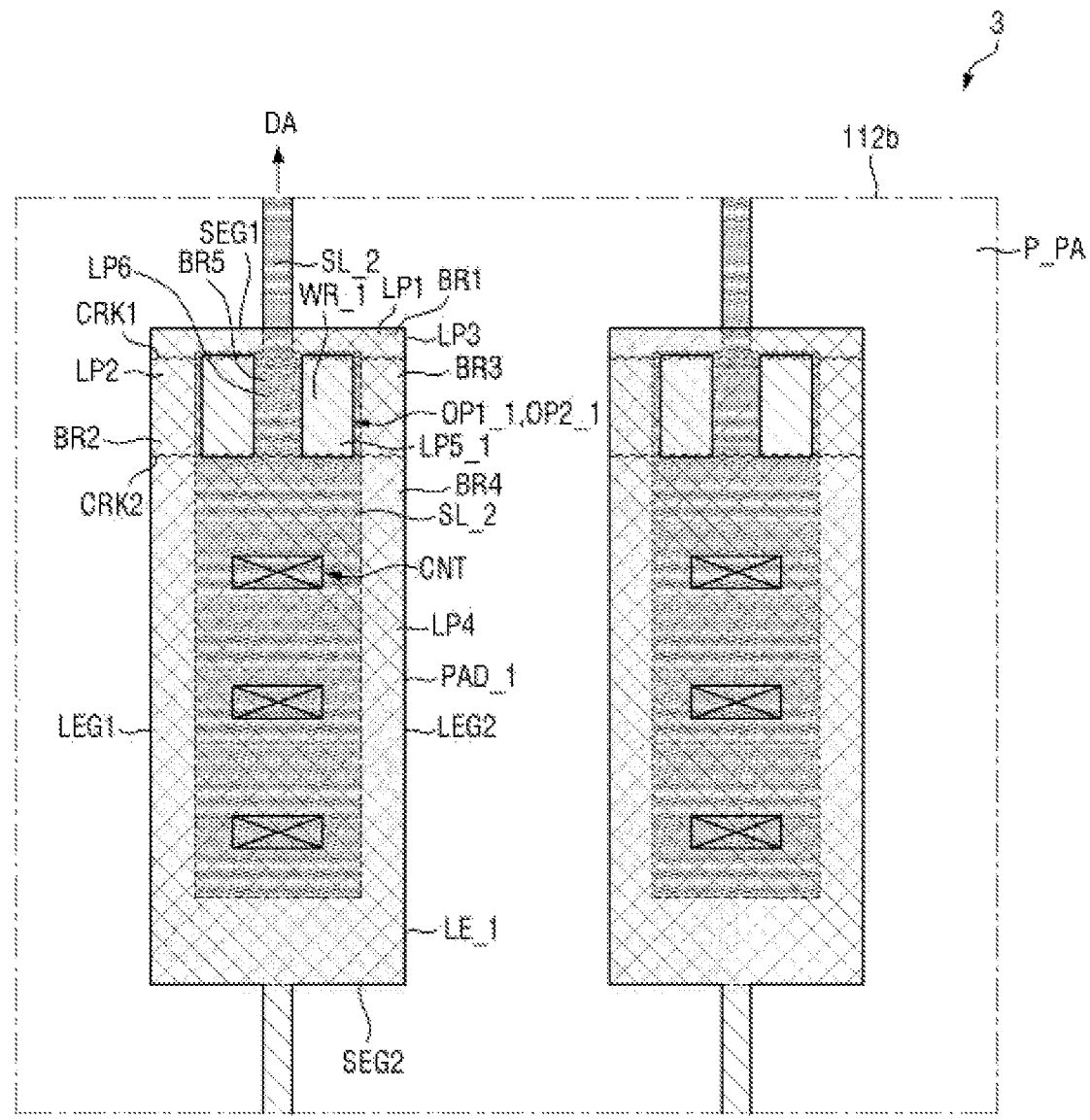
FIG. 12 is a plan layout view of a state in which a panel pad area of a display panel is attached to a flexible printed circuit board according to some exemplary embodiments.
Figure 13:
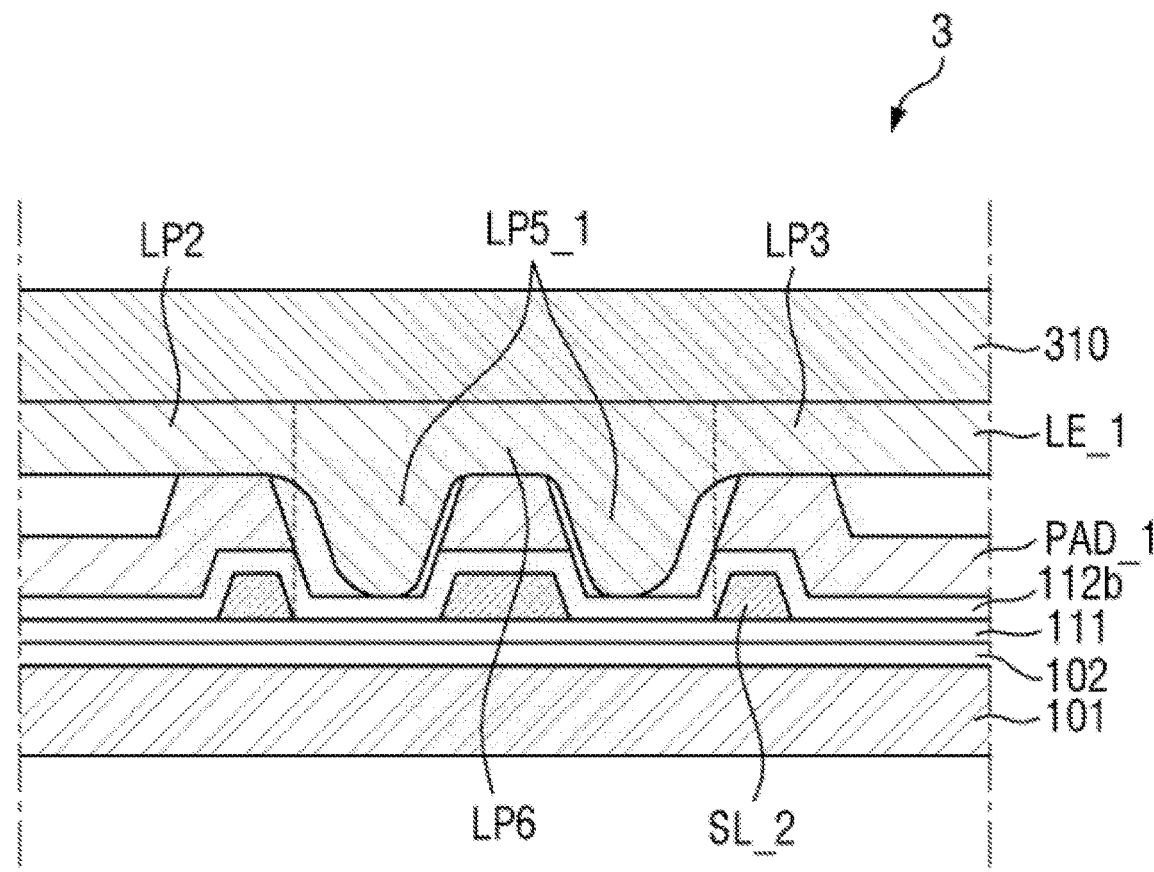
FIG. 13 is a cross-sectional view of FIG. 12 according to some exemplary embodiments.
Figure 13:
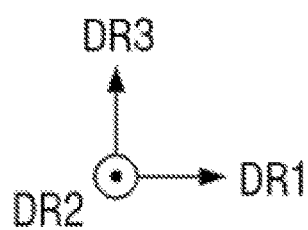

FIG. 12 is a plan layout view of a state in which a panel pad area of a display panel is attached to a flexible printed circuit board according to some exemplary embodiments. FIG. 13 is a cross-sectional view of FIG. 12 according to some exemplary embodiments.

Referring to FIGS. 12 and 13, a display device 3 according to some exemplary embodiments is different from the display device 1 in that a plurality of window portions WR_1 are provided. For instance, the window portions WR_1 according to some exemplary embodiments may be arranged to be spaced apart from each other along the first direction DR1 in a plan view. Although it is shown in FIG. 12 that the window portions WR_1 are spaced apart from each other and have the same shape and area, exemplary embodiments are not limited thereto. For instance, the window portions WR_1 may be spaced apart from each other and may have different shapes and areas from each other. Further, although it is shown in FIG. 12 that the number of the window portions WR_1 is two, exemplary embodiments are not limited thereto. For instance, the number of the window portions WR_1 may be three or more.

The fifth bonding portion BR5 of the panel pad area P_PA may be further disposed in a space between the window portions WR_1 of FIG. 12.

The connection wiring SL_2 may include second openings OP2_1 corresponding to the window portions WR_1 spaced apart from each other. That is, the second openings OP2_1 of the connection wiring SL_2 may be arranged to be spaced apart from each other along the first direction DR1.

The signal wiring PAD_1 may include first openings OP1_1 corresponding to the window portions WR_1 spaced apart from each other. That is, the first openings OP1_1 of the signal wiring PAD_1 may be arranged to be spaced apart from each other along the first direction DR1.

The lead wiring LE_1 may further include a sixth lead pattern LP6 disposed in the fifth bonding portion BR5 of the panel pad area P_PA. The sixth lead pattern LP6 may be physically connected to the fifth lead pattern LP5_1 disposed in the adjacent window portions WR_1. The thickness of the sixth lead pattern LP6 may be smaller than the thickness of the adjacent fifth lead pattern LP5_1. The sixth lead pattern LP6 may be in contact with the signal wiring PAD_1 in the fifth bonding portion BR5, and the sixth lead pattern LP6 and the signal wiring PAD_1 may be ultrasonically bonded to each other.

In the display device 3 according to some exemplary embodiments, the window portions WR_1 are arranged to be spaced apart from each other, and thus, the width of the aforementioned stepped portion of the panel pad area P_PA may be considerably reduced.

Even in the display device 3 according to some exemplary embodiments, the window portions WR_1 for physically separating the lead wiring LE_1 from the panel pad area P_PA, that is, the openings OP1_1 of the signal wiring PAD_1 may be formed closest to the display area DA, and thus, the area of the fourth lead pattern LP4 physically separated from the adjacent lead patterns LP1, LP2, LP3, LP5_1, and LP6 may be maximized relative to other lead patterns LP1, LP2, LP3, LP5_1, and LP6, thereby increasing the transmission efficiency of the external signal through the lead wiring LE_1 and the signal wiring PAD_1.

Figure 14:
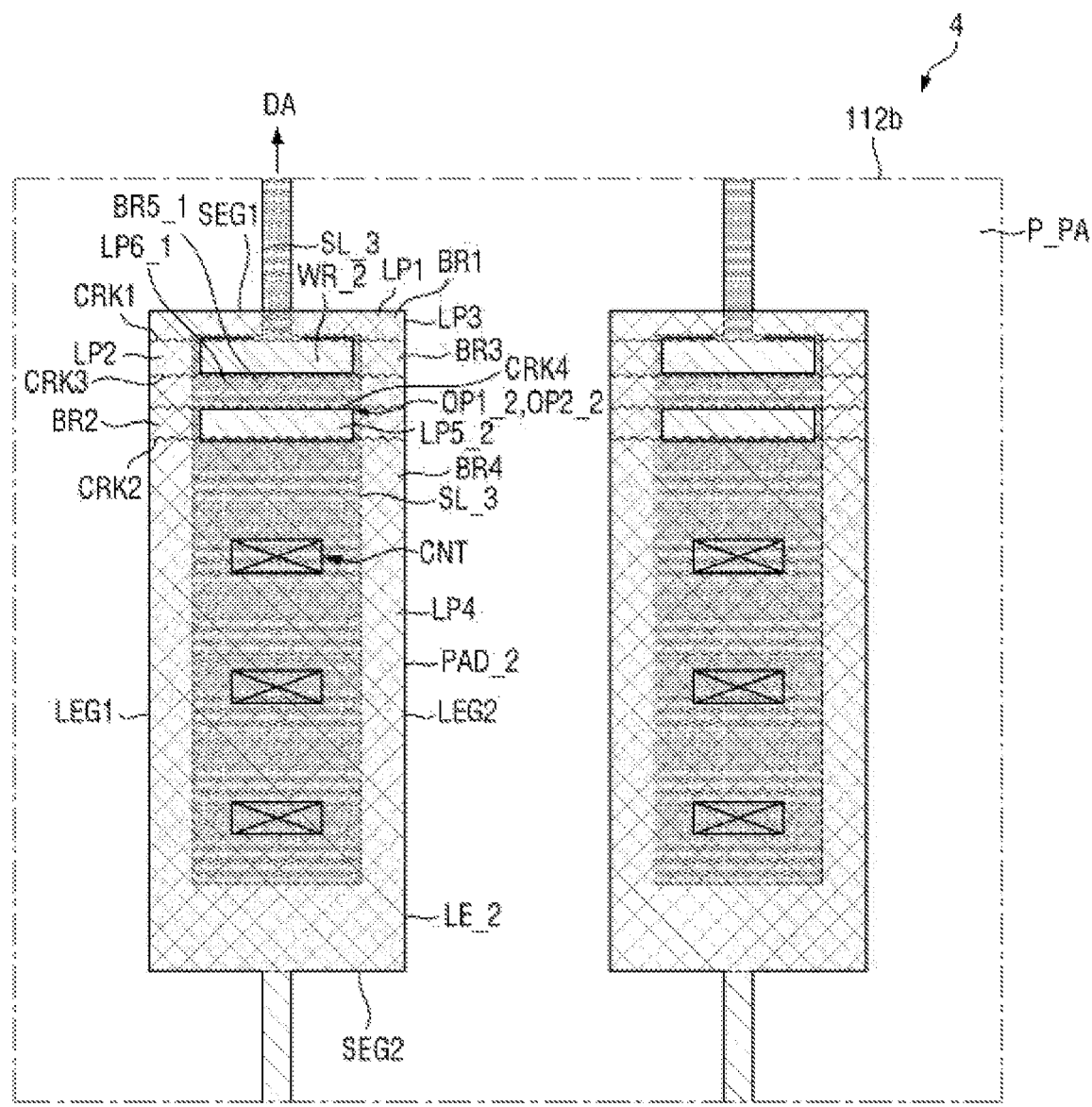
FIG. 14 is a plan layout view of a state in which a panel pad area of a display panel is attached to a flexible printed circuit board according to some exemplary embodiments.
Figure 14:
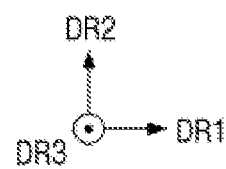
Figure 15:
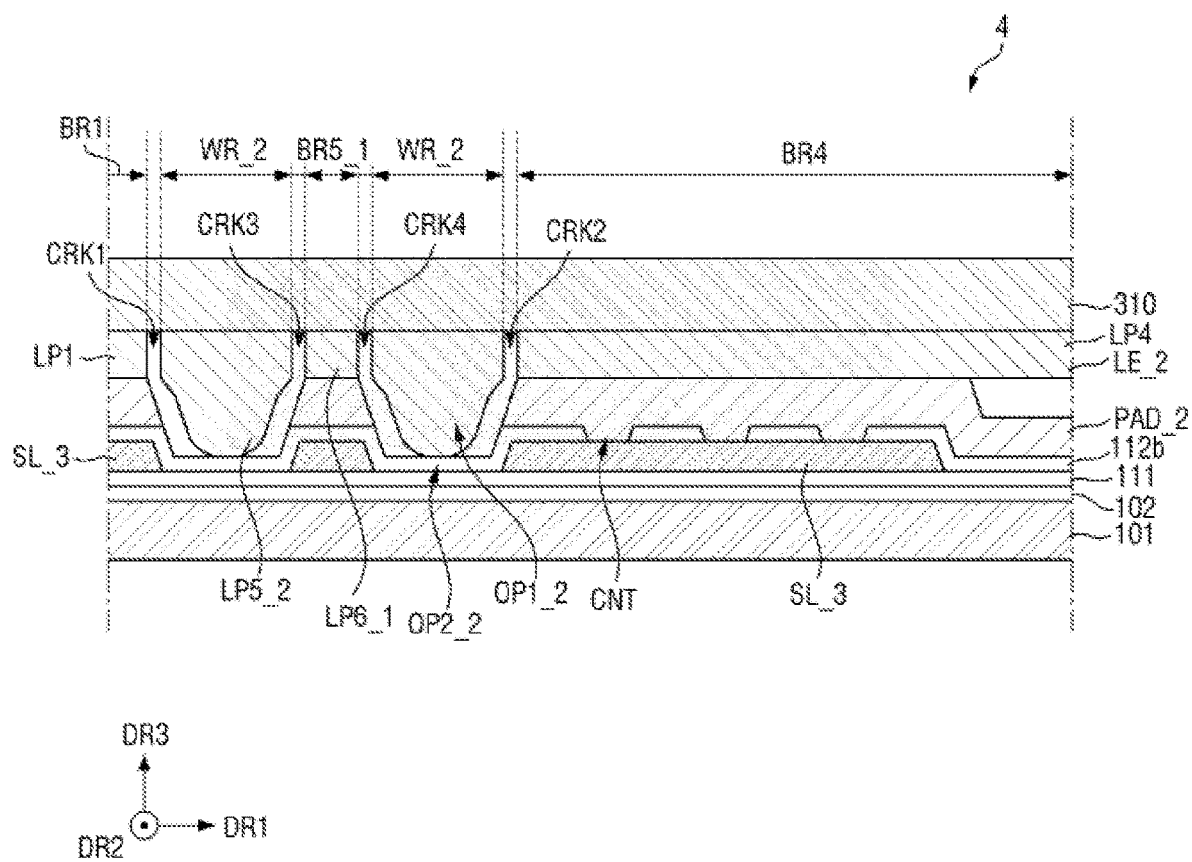
FIG. 15 is a cross-sectional view of FIG. 14 according to some exemplary embodiments.

FIG. 14 is a plan layout view of a state in which a panel pad area of a display panel is attached to a flexible printed circuit board according to some exemplary embodiments. FIG. 15 is a cross-sectional view of FIG. 14 according to some exemplary embodiments.

Referring to FIGS. 14 and 15, a display device 4 according to some exemplary embodiments is different from the display device 3 of FIGS. 12 and 13 in that a plurality of window portions WR_2 are arranged to be spaced apart from each other along the second direction DR2. For instance, the window portions WR_2 according to some exemplary embodiments may be arranged to be spaced apart from each other along the second direction DR2 in a plan view. The fifth bonding portion BR5_1 of the panel pad area P_PA may be further disposed in a space between the window portions WR_2 of FIGS. 14 and 15.

The connection wiring SL_3 may include second openings OP2_2 corresponding to the window portions WR_2 spaced apart from each other. For instance, the second openings OP2_2 of the connection wiring SL_3 may be arranged to be spaced apart from each other along the second direction DR2.

The signal wiring PAD_2 may include first openings OP1_2 corresponding to the window portions WR_2 spaced apart from each other. For instance, the first openings OP1_2 of the signal wiring PAD_2 may be arranged to be spaced apart from each other along the second direction DR2.

Referring to FIG. 15, as described above, in the window portions WR_2 spaced apart from each other, a display substrate 101, optically transparent insulating layers 102, 111, and 112b, and a lead wiring LE_2 are laminated, and in the fifth bonding portion BR5_1 disposed in a space between the window portions WR_2, a display substrate 101, a buffer layer 102, a first insulating layer 111, a connection wiring SL_3, a second insulating layer 112b, a signal wiring PAD_2, and a lead wiring LE_2 may be laminated. Thus, a stepped portion occurs between the window portions WR_2 and the regions around the window portions WR_2 of the signal wiring PAD_2. Due, at least in part, to the stepped portion, crack portions CK3 and CK4 may be further formed in the lead wiring LE_2.

As shown in FIGS. 14 and 15, the third and fourth crack portions CRK3 and CRK4 of the panel pad area P_PA may be formed along the long sides of the window portions WR_2. The third crack portion CRK3 may be disposed closer to the display area DA than the fourth crack portion CRK4. The third and fourth crack portions CRK3 and CRK4 may have a shape crossing the long sides of the lead wiring LE_2 in a plan view. Similarly to the first and second crack portions CRK1 and CRK2, the third and fourth crack portions CRK3 and CRK4 may penetrate the lead wiring LE_2 in the thickness direction from the surface of the lead wiring LE_2, and may physically separate the lead wiring LE_2 into a plurality of patterns.

The lead wiring LE_2 may further include a sixth lead pattern LP6_1 disposed in the fifth bonding portion BR5_1 of the panel pad area P_PA. The sixth lead pattern LP6_1 may be physically separated from the fifth lead pattern LP5_2 disposed in the window portions WR_2 disposed adjacent in an upward direction and a downward direction.

Even in the display device 4 according to some exemplary embodiments, the window portions WR_2 for physically separating the lead wiring LE_2 from the panel pad area P_PA, that is, the first openings OP1_2 of the signal wiring PAD_2 may be formed closest to the display area DA, and thus, the area of the fourth lead pattern LP4 physically separated from the adjacent lead patterns LP1, LP2, LP3, LP5_2, and LP6_1 may be maximized relative to other lead patterns LP1, LP2, LP3, LP5_2, and LP6_1, thereby increasing the transmission efficiency of the external signal through the lead wiring LE_2 and the signal wiring PAD_2.

Figure 16:
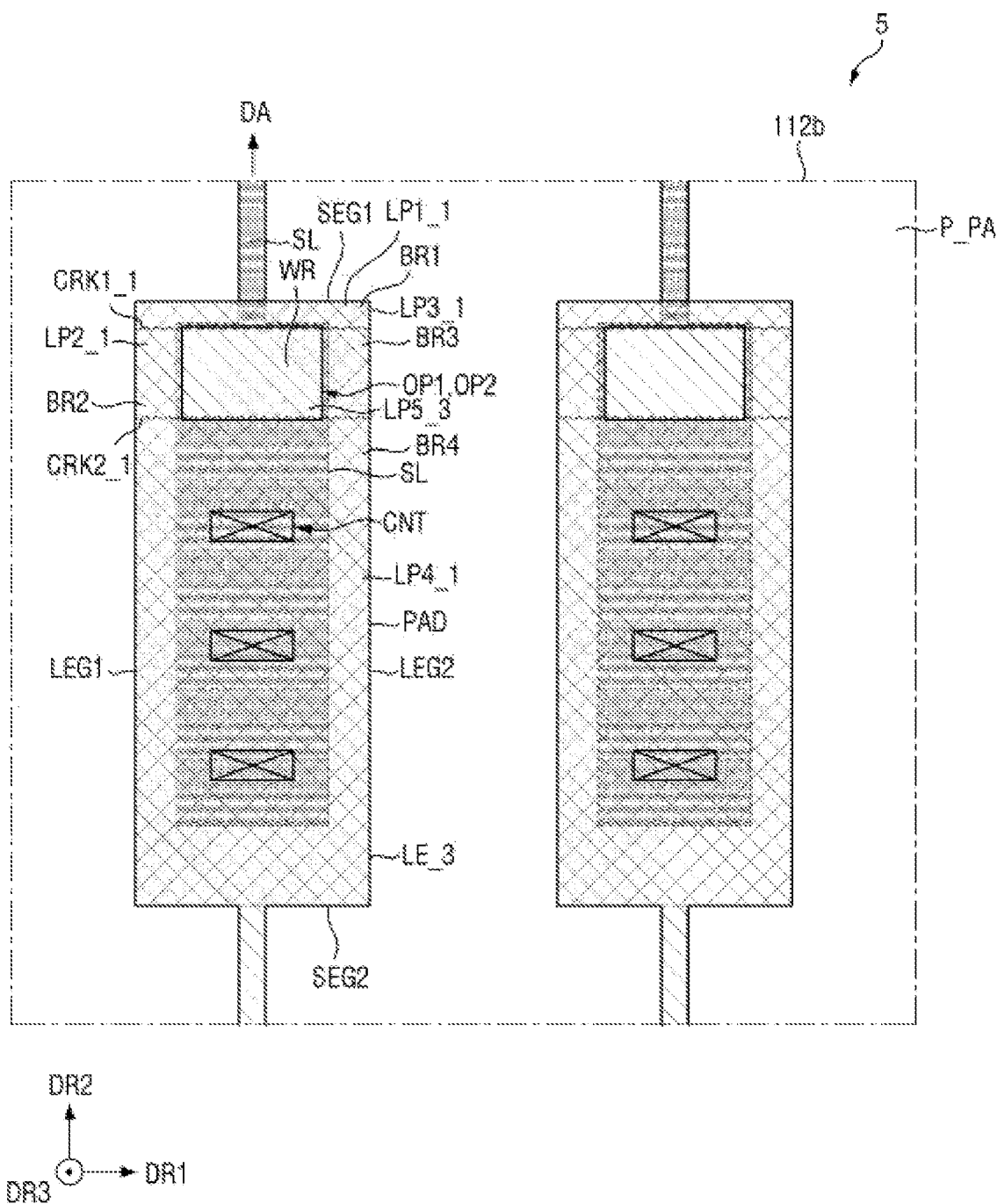
FIG. 16 is a plan layout view of a state in which a panel pad area of a display panel is attached to a flexible printed circuit board according to some exemplary embodiments.
Figure 17:
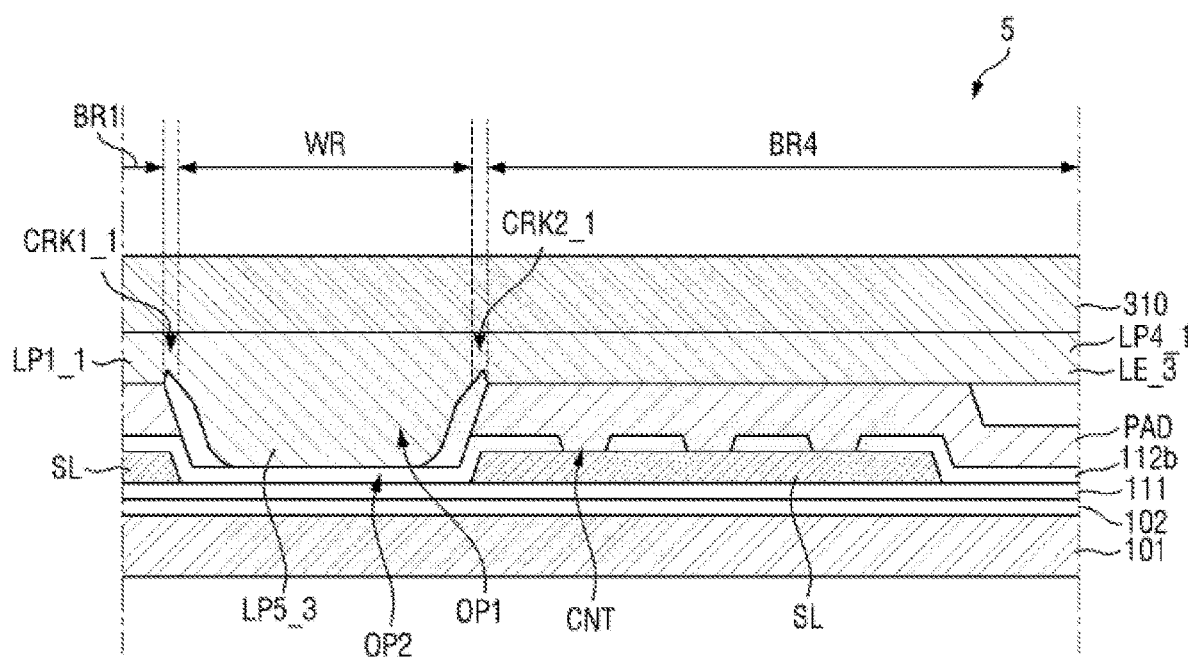
FIG. 17 is a cross-sectional view of FIG. 16 according to some exemplary embodiments.

FIG. 16 is a plan layout view of a state in which a panel pad area of a display panel is attached to a flexible printed circuit board according to some exemplary embodiments. FIG. 17 is a cross-sectional view of FIG. 16 according to some exemplary embodiments.

Referring to FIGS. 16 and 17, a display device 5 according to some exemplary embodiments is different from the display device 1 in that adjacent lead patterns of a lead wiring LE_3 are connected to each other in first and second crack portions CRK1_1 and CRK2_1 of the panel pad area P_PA. For instance, in the display device 5, the adjacent lead patterns of the lead wiring LE_3 are connected to each other in the first and second crack portions CRK1_1 and CRK2_1 of the panel pad area P_PA. That is, the first and second crack portions CRK1_1 and CRK2_1 of the panel pad area P_PA according to some exemplary embodiments may be internally terminated without completely penetrating the lead wiring LE_3 in the thickness direction of the lead wiring LE_3.

As shown in FIG. 17, each of the first and second crack portions CRK1_1 and CRK2_1 of the panel pad area P_PA according to some exemplary embodiments may have a groove shape. The first lead pattern LP1_1 of the lead wiring LE_3 may be physically connected to the adjacent second lead pattern, third lead pattern, and fifth lead pattern LP2_1, LP3_1, and LP5_3, and the fourth lead pattern LP4_1 of the lead wiring LE_3 may be physically connected to the adjacent second lead pattern, third lead pattern, and fifth lead patterns LP2_1, LP3_1, and LP5_3. Unlike the lead wiring LE, the lead wiring LE_3 according to some exemplary embodiments may be physically connected integrally with the adjacent lead patterns. However, in the first and second crack portions CRK1_1 and CRK2_1, the electrical resistance of the lead wiring LE_3 may rapidly increase, and thus, external signal transmission may be disturbed.

Therefore, even in the display device 5 according to some exemplary embodiments, the window portion WR for forming the groove of the lead wiring LE_3 in the panel pad area P_PA, that is, the first opening OP1 of the signal wiring PAD may be formed closest to the display area DA, and thus, the area of the fourth lead pattern LP4_1 may be maximized relative to other lead patterns LP1_1, LP2_1, LP3_1, and LP5_3, thereby increasing the transmission efficiency of the external signal through the lead wiring LE_3 and the signal wiring PAD.

Figure 18:
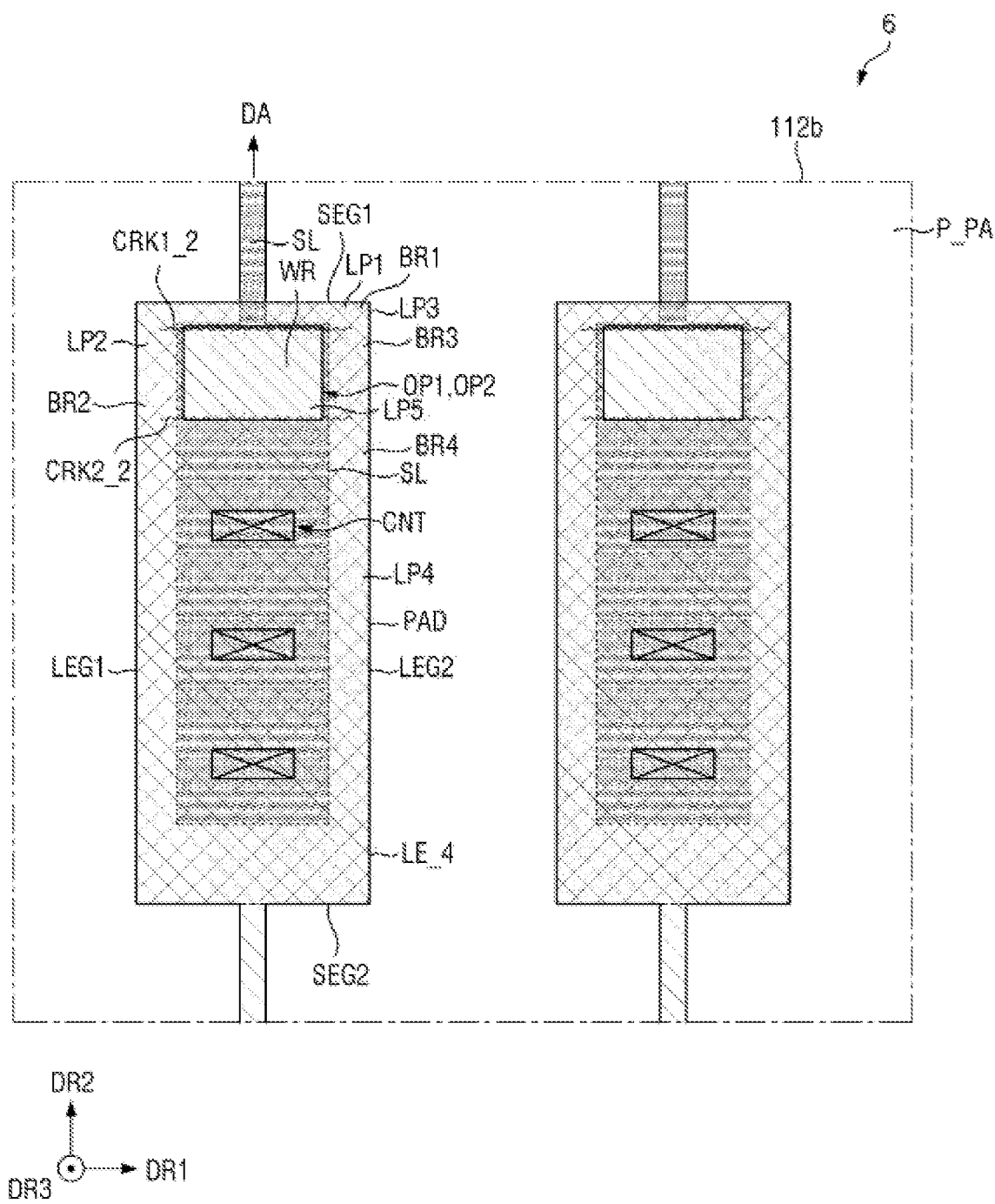
FIG. 18 is a plan layout view of a state in which a panel pad area of a display panel is attached to a flexible printed circuit board according to some exemplary embodiments.

FIG. 18 is a plan layout view of a state in which a panel pad area of a display panel is attached to a flexible printed circuit board according to some exemplary embodiments.

In a display device 6 according to some exemplary embodiments, as shown in FIG. 18, first and second crack portions CRK1_2 and CRK2_2 of the panel pad area P_PA may be disposed between long sides of a lead wiring LE_4 without intersecting the long sides of the lead wiring LE_4 in a plan view.

According to various exemplary embodiments, the shape of each of the crack portions according to FIGS. 16, 17, and 18, and the shape of the associated lead wiring according to the shape thereof may be variously applied to the lead wiring LE and lead wirings to be described later.

Figure 19A:
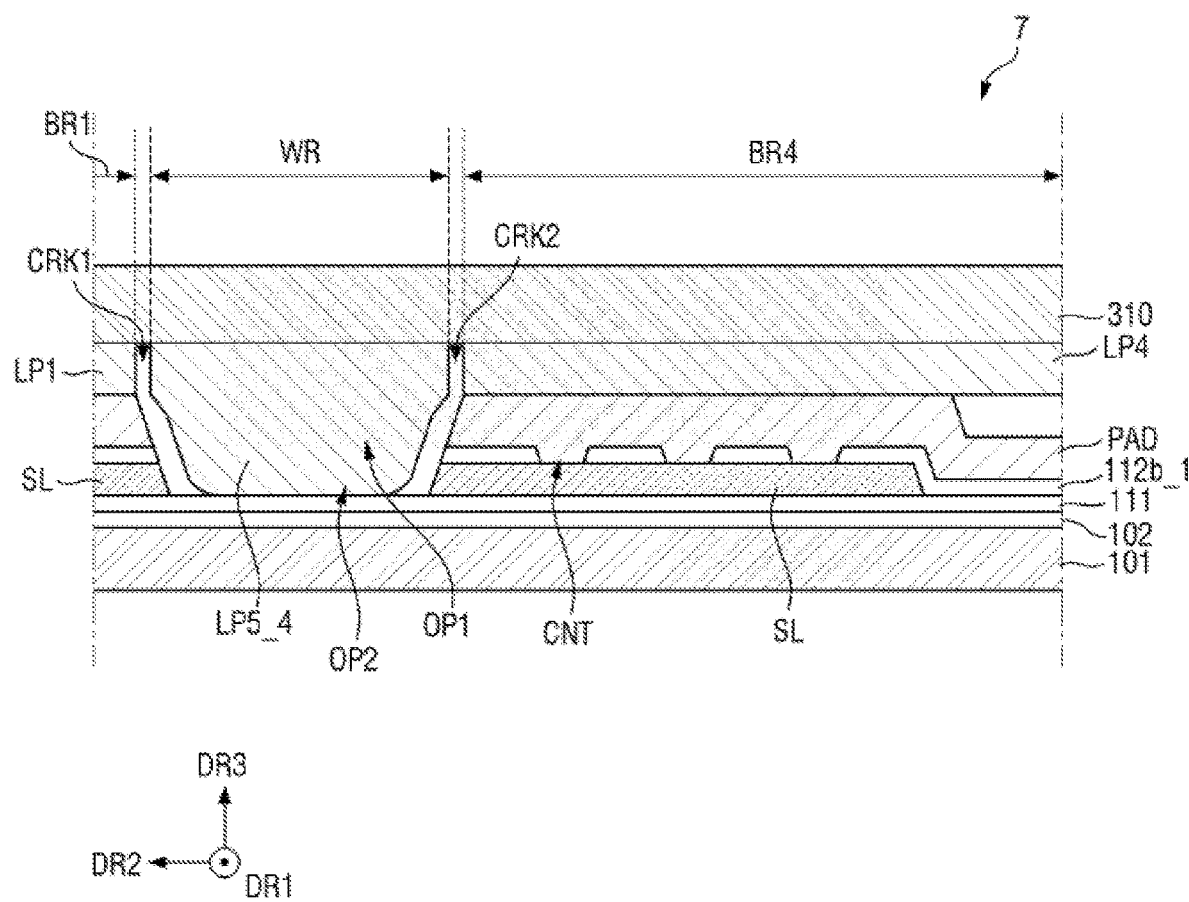
FIGS. 19A, 19B, and 19C are cross-sectional views of a panel pad area of a display device according to various exemplary embodiments.
Figure 19B:
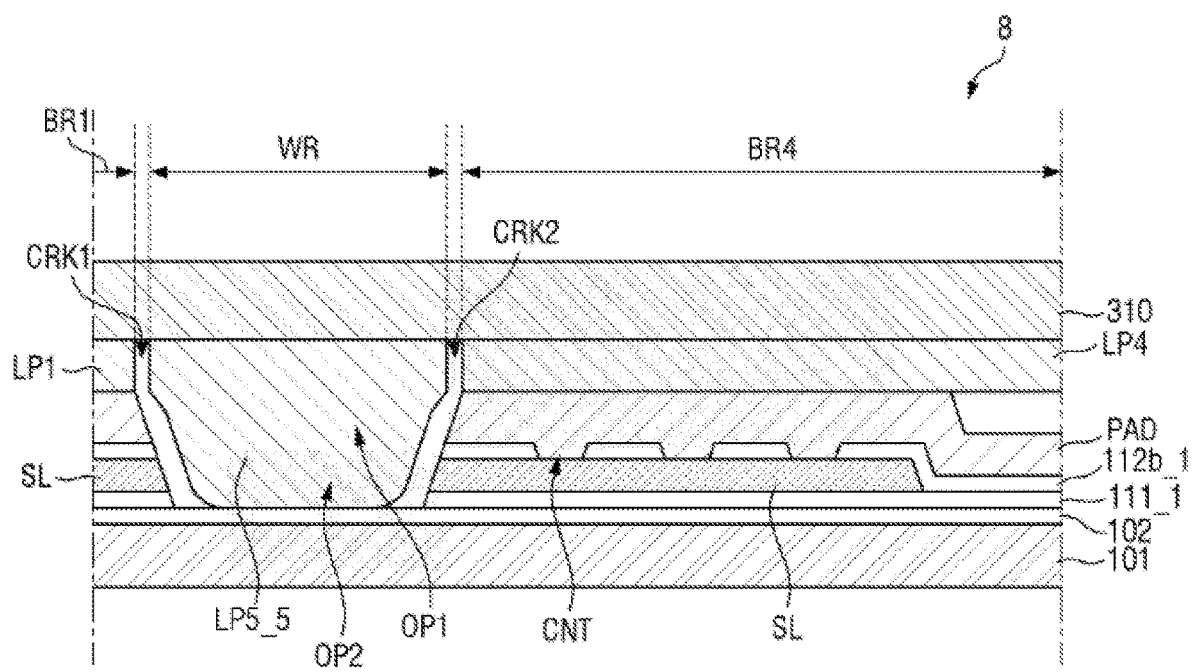
Figure 19B:
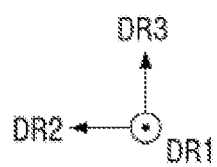
Figure 19C:
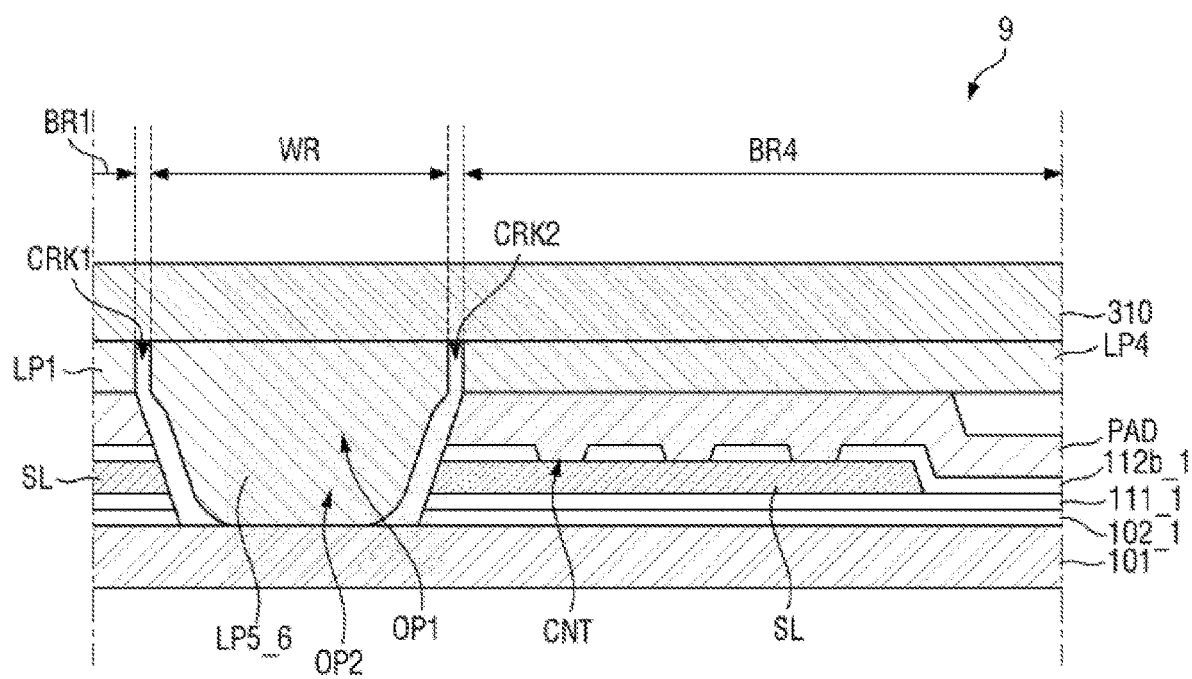
Figure 19C:
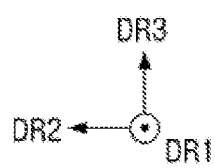

FIGS. 19A to 19C are cross-sectional views of a panel pad area of a display device according to various exemplary embodiments.

It is illustrated in FIGS. 19A to 19C that the laminated structure of transparent insulating layers disposed in the associated window portions WR of the display devices 7, 8, and 9 may be variously modified.

Referring to FIG. 19A, a second insulating layer 112b_1 may not be disposed in the window portion WR of the display device 7. Therefore, a fifth lead pattern LP5_4 of the lead wiring may be in direct contact with an exposed portion of the first insulating layer 111.

Referring to FIG. 19B, a second insulating layer 112b_1 and a first insulating layer 111_1 may not be disposed in the window portion WR of the display device 8. Therefore, a fifth lead pattern LP5_5 of the lead wiring may be in direct contact with an exposed portion of the buffer layer 102.

Referring to FIG. 19C, a second insulating layer 112b_1, a first insulating layer 111_1, and a buffer layer 102_1 may not be disposed in the window portion WR of the display device 9. Therefore, a fifth lead pattern LP5_6 of the lead wiring may be in direct contact with an exposed portion of the display substrate 101.

It is contemplated that the laminated structures of the window portions WR of the display devices 7, 8, and 9 may be variously applied to the various, previously described window portions WR, WR_1, and WR_2, and window portions WR to be described later, and may be combined with each other.

Figure 20:
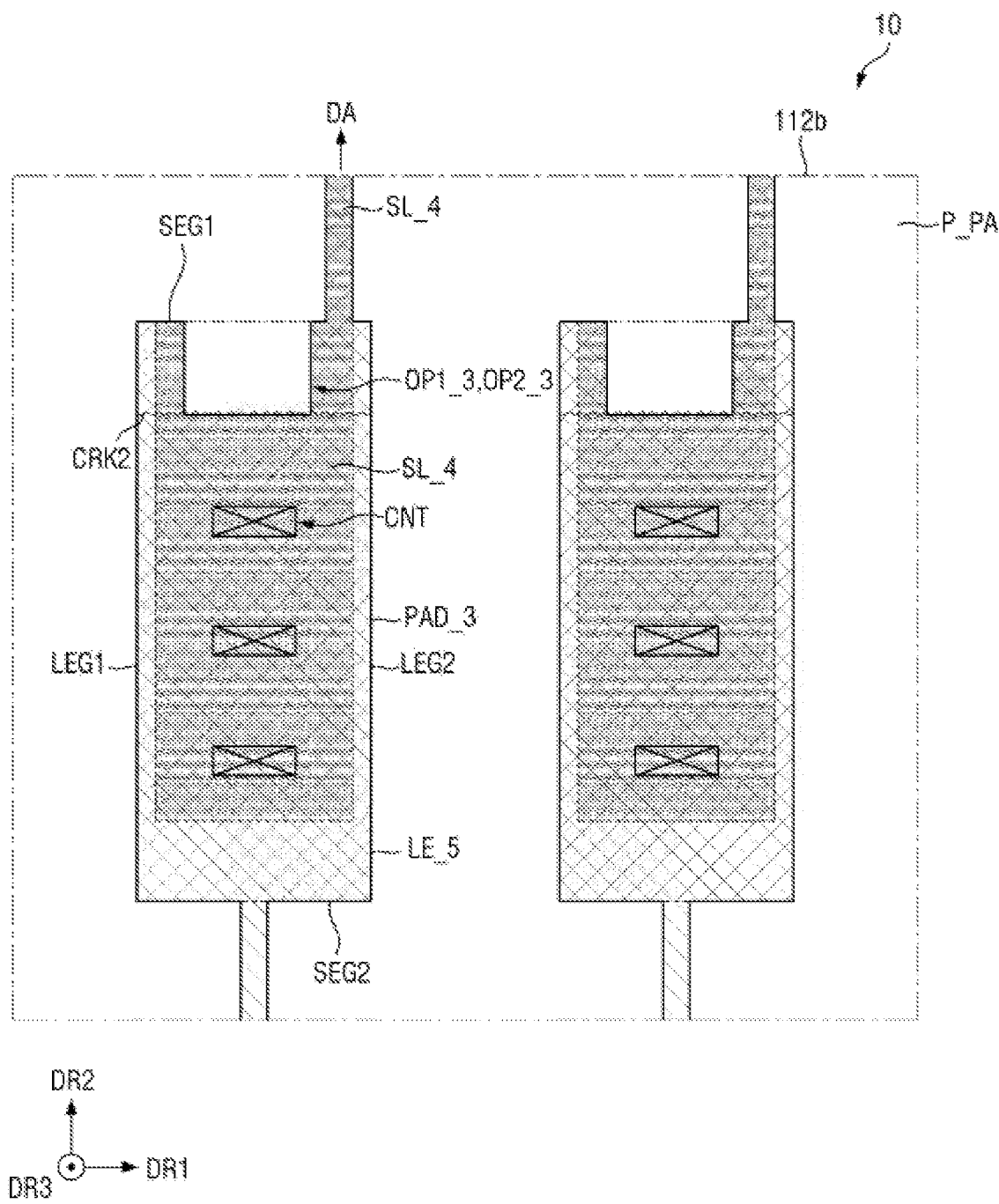
FIG. 20 is a plan layout view of a state in which a panel pad area of a display panel is attached to a flexible printed circuit board according to some exemplary embodiments.

FIG. 20 is a plan layout view of a state in which a panel pad area of a display panel is attached to a flexible printed circuit board according to some exemplary embodiments.

Referring to FIG. 20, the shapes of openings of a signal wiring PAD_3 and a connection wiring SL_4 of a display device 10 according to some exemplary embodiments are different from the shapes of the openings of the signal wiring PAD and the connection wiring SL of the display device 1. For instance, the first opening OP1_3 of the signal wiring PAD_3 according to some exemplary embodiments may have a trench shape recessed from one edge of the signal wiring PAD_3, and the second opening OP2_3 of the connection wiring SL_4 may have a trench shape recessed from one edge of the connection wiring SL_4.

The signal wiring PAD_3 may include short edges SEG1 and SEG2 extending in the first direction DR1 and long edges LEG1 and LEG2 extending in the second direction DR2. The first short edge SEG1 may be disposed closer to the display area DA than the second short edge SEG2. As shown in FIG. 20, the first opening OP1_3 of the signal wiring PAD_3 may have a trench shape recessed in a direction opposite to the direction from the first short edge SEG1 of the signal wiring PAD_3 toward the display area DA. Similarly, the connection wiring SL_4 may include short and long edges corresponding to the short and long edges SEG1, SEG2, LEG1, and LEG2 of the signal wiring PAD_3. The second opening OP2_3 of the connection wiring SL_4 may have a trench shape recessed in a direction opposite to the direction from the first short edge of the connection wiring SL_4, adjacent to the first short edge SEG1 of the signal wiring PAD_3, toward the display area DA.

Figure 21:
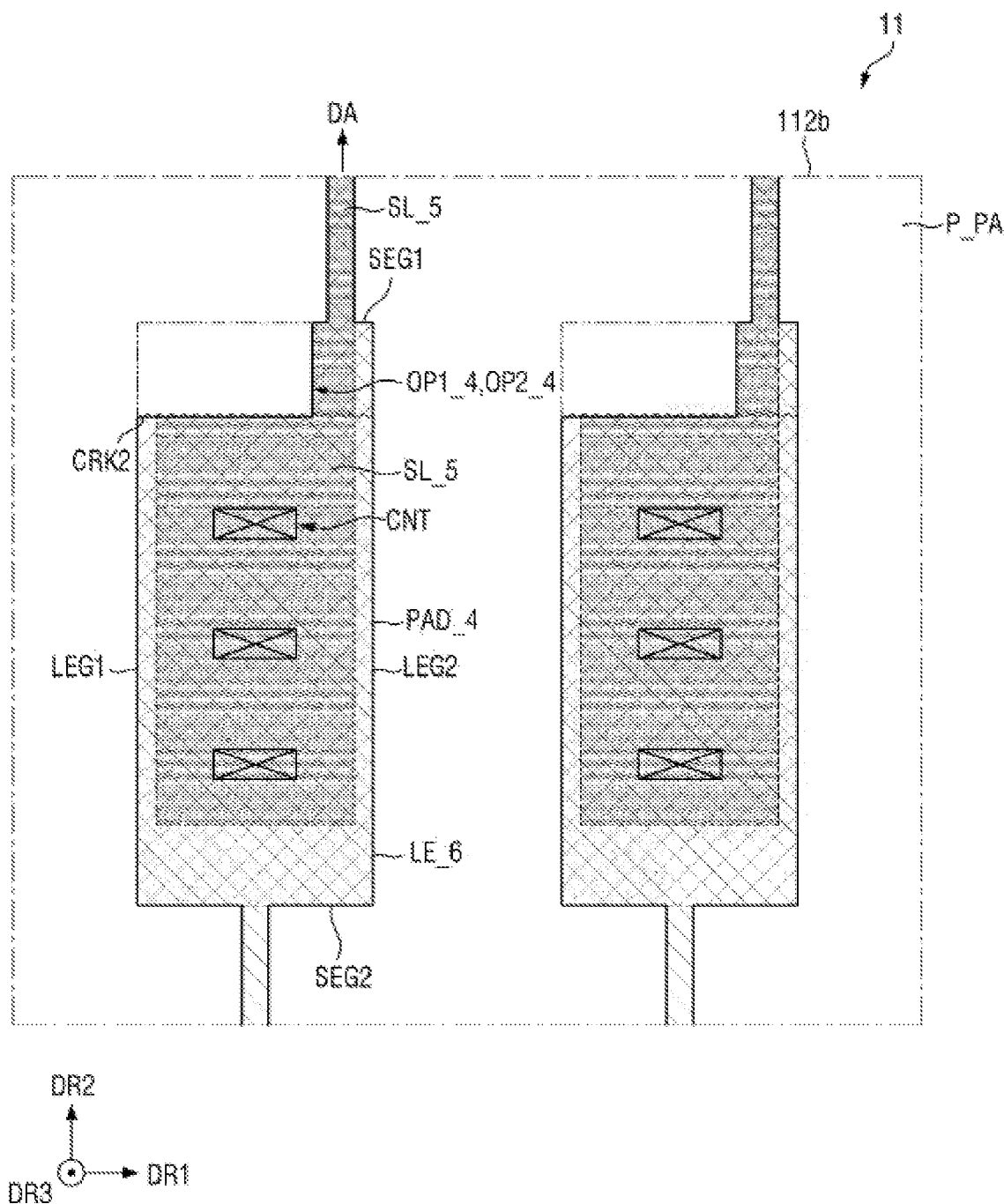
FIG. 21 is a plan layout view of a state in which a panel pad area of a display panel is attached to a flexible printed circuit board according to some exemplary embodiments.

FIG. 21 is a plan layout view of a state in which a panel pad area of a display panel is attached to a flexible printed circuit board according to some exemplary embodiments.

Referring to FIG. 21, the trench shapes of openings of a signal wiring PAD_4 and a connection wiring SL_5 of a display device 11 according to some exemplary embodiments are different from the trench shapes of the openings of the signal wiring PAD_3 and the connection wiring SL_4 of the display device 10. For instance, the signal wiring PAD_4 according to some exemplary embodiments may have a first long edge LEG1 located at left side of the signal wiring PAD_4 and a second long edge LEG2 facing the first long edge LEG1. As shown in FIG. 21, the first opening OP1_4 of the signal wiring PAD_4 may have a trench shape recessed in a direction opposite to the direction from the first short edge SEG1 of the signal wiring PAD_4 toward the display area DA and recessed in a direction from the first long edge LEG1 toward the central region of the signal wiring PAD_4. However, exemplary embodiments are not limited thereto. For instance, the first opening OP1_4 of the signal wiring PAD_4 may have a trench shape recessed in a direction opposite to the direction from the first short edge SEG1 of the signal wiring PAD_4 toward the display area DA and recessed in a direction from the second long edge LEG2 toward the central region of the signal wiring PAD_4.

Similarly to the trench shape of the first opening OP1_4 of the signal wiring PAD_4, the second opening OP2_4 of the connection wiring SL_5 may have a trench shape recessed from at least one of the first short and long edges SEG1 and LEG1 adjacent to the display area DA.

Figure 22:
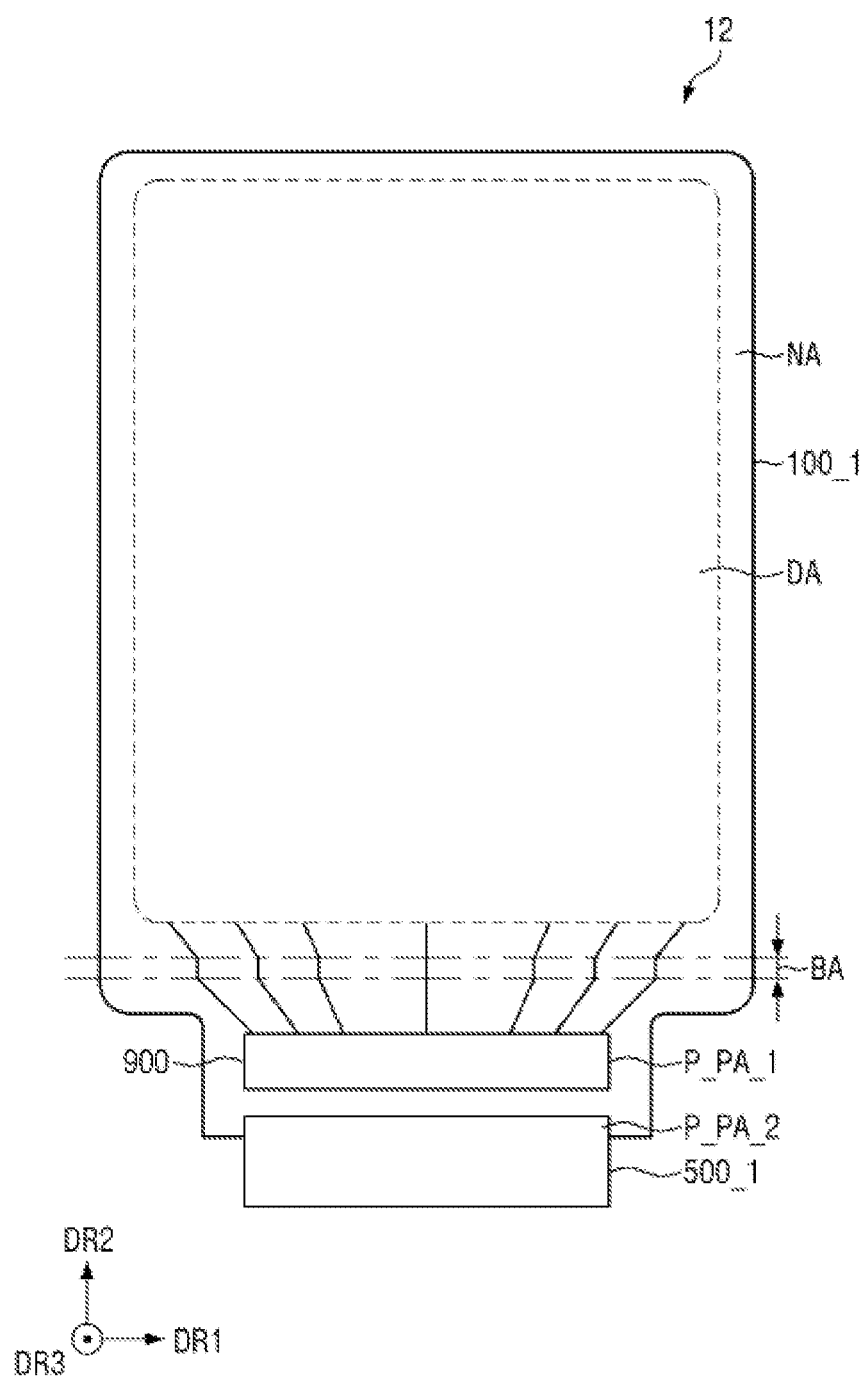
FIG. 22 is a plan layout view of a display device according to some exemplary embodiments.
Figure 23:
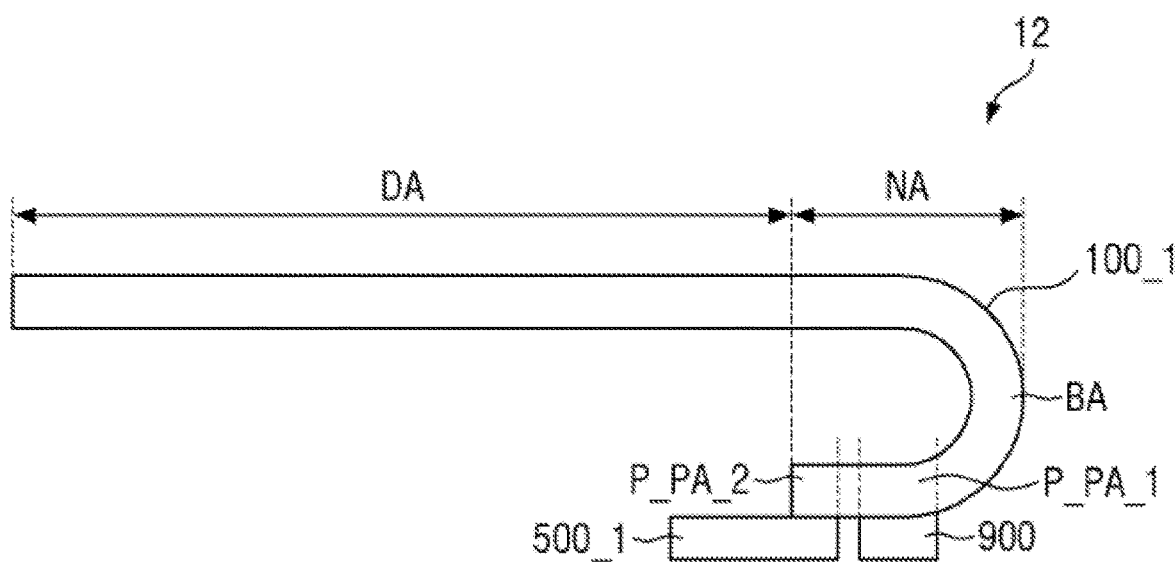
FIG. 23 is a cross-sectional view of a display device according to some exemplary embodiments.
Figure 23:
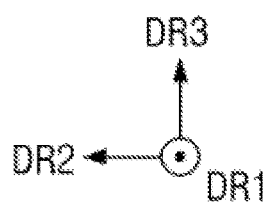

FIG. 22 is a plan layout view of a display device according to some exemplary embodiments. FIG. 23 is a cross-sectional view of the display device of FIG. 22 according to some exemplary embodiments.

Referring to FIGS. 22 and 23, a display panel 100_1 of a display device 12 according to some exemplary embodiments may further include a bending area BA.

A display substrate 101 of the display panel 100_1 may be made of an insulating material, such as a polymer resin. Examples of the polymer resin may include at least one of polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), and/or combinations thereof. The display substrate may be a flexible substrate capable of bending, folding, rolling, flexing, and/or the like. An example of the material constituting the flexible substrate 101 may be polyimide (PI), but exemplary embodiments are not limited thereto.

The bending area BA may be disposed between an array of a plurality of pixels in a display area DA and a panel pad area P_PA_1. The bending area BA may be located in the non-display area NA. The display panel 100_1 may be folded (or otherwise bent, rolled, flexed, etc.) in one direction about a bending line that is a reference line disposed in the bending area BA. The bending line may be a straight line parallel to the lower side (or upper side) of the display panel 100_1. As shown in FIG. 23, the bending area BA of the display panel 100_1 may be bent downward in the third direction DR3. However, exemplary embodiments are not limited thereto. For instance, the display area DA and the panel pad area P_PA_1 may be connected to each other without the bending area BA. That is, the display panel 100_1 may be flat over the entire display area DA and non-display area NA without the bending area BA.

The plurality of connection wirings SL, the plurality of signal wirings PAD, and the plurality of the lead wirings LE, which have been described with reference to at least FIG. 5, are arranged in the panel pad area P_PA_1. Therefore, a redundant description will be omitted.

A driving integrated circuit 900 may be attached onto the plurality of signal wirings PAD. In some exemplary embodiments, the driving integrated circuit 900 may be applied in a chip-on-plastic (COP) manner or a chip-on-glass (COG) manner. The driving integrated circuit 900 may include a plurality of bumps connected to the plurality of signal wirings PAD. The bumps may be formed of at least one of gold (Au), nickel (Ni), and tin (Sn); however, exemplary embodiments are not limited thereto.

According to some exemplary embodiments, the bumps of the driving integrated circuit 900 may be coupled to directly to, and, thereby, contact the respective signal wirings PAD without intervening other layers or structures. The direct coupling between the bumps of the driving integrated circuit 900 and the respective signal wirings PAD may be performed by ultrasonic bonding.

According to various exemplary embodiments, it is possible to prevent the transmission of a signal received from a connection unit from being disturbed by cracks in a lead wiring caused by an ultrasonic bonding inspection unit. The effects of various exemplary embodiments are not limited by the foregoing, and other various effects are anticipated.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device, comprising:
a display substrate comprising:
a display area; and
a pad area disposed outside the display area;
a first connection wiring disposed on the pad area of the display substrate; and
a signal wiring disposed on the first connection wiring of the pad area of the display substrate, the signal wiring being electrically connected to the first connection wiring through a first contact hole,
wherein:
the signal wiring comprises a first opening having a first through-hole disposed in the signal wiring and substantially completely surrounded by the signal wiring in a plan view; and
the first opening is disposed closer to the display area than the first contact hole.

2. The display device of claim 1, wherein:
the first connection wiring comprising a second opening at least partially surrounded by the first connection wiring in the plan view; and
the second opening overlaps the first opening in a thickness direction.

3. The display device of claim 2, wherein:
the first opening penetrates the signal wiring in the thickness direction from a surface of the signal wiring; and
the second opening penetrates the first connection wiring in the thickness direction from a surface of the first connection wiring.

4. The display device of claim 3, further comprising:
an insulating pattern disposed between the first connection wiring and the signal wiring, the insulating pattern comprising the first contact hole therein,
wherein the insulating pattern overlaps the first opening in the thickness direction.

5. The display device of claim 4, wherein the insulating pattern comprises an optically transparent inorganic material.

6. The display device of claim 3, further comprising:
an insulating pattern disposed between the first connection wiring and the signal wiring, the insulating pattern comprising the first contact hole therein,
wherein the insulating pattern does not overlap the first opening and the second opening.

7. The display device of claim 3, wherein:
the second opening comprises a second through-hole disposed in the first connection wiring and completely surrounded by the first connection wiring in the plan view.

8. The display device of claim 3, wherein:
the first opening has a trench shape recessed from an edge of the signal wiring in the plan view, and
the second opening has a trench shape recessed from an edge of the first connection wiring in the plan view.

9. The display device of claim 3, wherein:
the display area comprises a thin film transistor; and
the first connection wiring is further disposed in the display area and is connected to the thin film transistor.

10. The display device of claim 3, further comprising:
a second connection wiring separated from the first connection wiring, the second connection wiring being connected to the signal wiring through a second contact hole,
wherein:
the display area comprises a thin film transistor; and
the second connection wiring electrically connects the thin film transistor and the signal wiring.

11. The display device of claim 10, wherein:
the second connection wiring is disposed closer to the display area than the first connection wiring; and
the second contact hole is disposed closer to the display area than the first contact hole.

12. The display device of claim 11, wherein the first opening is disposed between the first contact hole and the second contact hole.

13. A display device, comprising:
a display substrate comprising:
a display area; and
a pad area disposed outside the display area;
a connection wiring disposed on the pad area of the display substrate;
a signal wiring disposed on the connection wiring of the pad area of the display substrate, the signal wiring being electrically connected to the connection wiring through a contact hole; and
a flexible circuit board comprising a lead wiring attached to the pad area of the display substrate, the flexible circuit board overlapping the signal wiring,
wherein:
the signal wiring comprises a first opening having a first through-hole disposed in the signal wiring and substantially completely surrounded by the signal wiring in a plan view;

the connection wiring comprises a second opening at least partially surrounded by the connection wiring and overlapping the first opening in a thickness direction in the plan view; and the first opening and the second opening are disposed closer to the display area than the contact hole.

14. The display device of claim 13, wherein:

the first opening penetrates the signal wiring in the thickness direction from a surface of the signal wiring; and the second opening penetrates the connection wiring in the thickness direction from a surface of the connection wiring.

15. The display device of claim 14, further comprising:

an insulating pattern disposed between the connection wiring and the signal wiring, the insulating pattern comprising the contact hole therein, wherein the insulating pattern does not overlap the first opening and the second opening.

16. The display device of claim 15, wherein:

the signal wiring comprises:
- a first short edge extending along a first direction in the plan view; and
- a second short edge disposed closer to the display area than the first short edge;

the first direction intersects a direction from the pad area toward the display area; and the lead wiring comprises:
- a first lead pattern disposed between the first short edge and the first opening; and
- a second lead pattern partially overlapping the first opening.

17. The display device of claim 16, wherein:

the lead wiring further comprises a lead crack disposed between the first lead pattern and the second lead pattern; and the lead crack penetrates the lead wiring in the thickness direction to completely separate the first lead pattern and the second lead pattern along the first direction in the plan view.

18. The display device of claim 17, wherein a thickness of the second lead pattern overlapping the first opening is greater than a thickness of the first lead pattern.

19. The display device of claim 13, wherein the signal wiring and the lead wiring are in direct contact with each other.

20. The display device of claim 19, wherein the signal wiring and the lead wiring are ultrasonically bonded to each other.

* * * * *